United States Patent [19]

DiStefano et al.

[11] Patent Number: 5,570,504
[45] Date of Patent: Nov. 5, 1996

[54] MULTI-LAYER CIRCUIT CONSTRUCTION METHOD AND STRUCTURE

[75] Inventors: Thomas H. DiStefano, Bronxville; Igor Y. Khandros, Peekskill; Gary W. Grube, Monroe, all of N.Y.

[73] Assignee: Tessera, Inc., San Jose, Calif.

[21] Appl. No.: 393,165

[22] Filed: Feb. 21, 1995

Related U.S. Application Data

[62] Division of Ser. No. 105,641, Aug. 12, 1993, which is a division of Ser. No. 816,634, Dec. 31, 1991, Pat. No. 5,282,312.

[51] Int. Cl.$^6$ .................................................. H05K 3/36
[52] U.S. Cl. .............................. 29/830; 29/846; 29/852; 427/97
[58] Field of Search ............................ 29/830, 846, 852; 427/97

[56] References Cited

U.S. PATENT DOCUMENTS

| | | |
|---|---|---|
| 3,077,511 | 2/1963 | Bohrer et al. . |
| 3,214,827 | 11/1965 | Phohofsky . |
| 3,316,618 | 5/1967 | Guarracini . |
| 3,316,619 | 5/1967 | Beelitz . |
| 3,509,270 | 4/1970 | Dube . |
| 3,541,222 | 11/1970 | Parks et al. . |
| 3,546,775 | 12/1970 | Lalmond et al. . |
| 3,561,110 | 2/1971 | Feulner et al. . |

(List continued on next page.)

FOREIGN PATENT DOCUMENTS

| | | |
|---|---|---|
| 0167732 | 1/1986 | European Pat. Off. . |
| 0218437 | 4/1987 | European Pat. Off. . |
| 0229850 | 7/1987 | European Pat. Off. . |
| 0346525 | 12/1989 | European Pat. Off. . |
| 379736 | 8/1990 | European Pat. Off. . |
| 0437980 | 7/1991 | European Pat. Off. . |
| 2312172 | 12/1976 | France . |
| 2902002 | 7/1980 | Germany . |
| 47-19142 | 6/1972 | Japan . |
| 2-265296 | 10/1990 | Japan . |
| 85/02751 | 6/1985 | WIPO . |

OTHER PUBLICATIONS

Research Disclosure No. 334, Feb. 1992, p. 38, "Multilayer Construction Technique for PCB", abstract No. 334 06 *whole document*.
IBM Technical Disclosure Bulletin, vol. 21, No. 4, Sep. 1978, "Multilayer Laminated Chip Carrier"pp. 1396–1397.
IBM Technical Disclosure Bulletin, vol. 16, No. 1, Jun. 1973, p. 38 N. C. Mescia et al. "Interconnection For Stacked Substrates having Integrated Chips".
Electronic Packaging & Production, vol. 29., No. 2, Feb. 1989, pp. 134–137, K. Gileos "A Simplified Version of the Multilayer Circuit Process".

*Primary Examiner*—Carl J. Arbes
*Attorney, Agent, or Firm*—Lerner, David, Littenberg, Krumholz & Mentlik

[57] ABSTRACT

Multilayer circuit assemblies are made by stacking circuit panels having contacts on their top surfaces, through conductors extending between top and bottom surfaces and terminals connected to the bottomend of each through conductor. The terminals and contacts are arranged so that when the panels are stacked the terminals on the bottom of one panel are in alignment with the contacts on the top surface of the immediately underlying panel. The panels are selectively treated on their top and/or bottom surfaces so as to selectively disconnect or connect each contact to a terminal on the bottom surface of the same panel. For example, the top surface of the panel may be selectively etched to disconnect a contact from one through conductor and hence from the associated terminal. The aligned terminals and contacts are nonselectively connected to one another at each interface so that wherever a terminal and contact on adjacent panels are aligned with one another there are connected to one another. This forms composite vertical conductors extending through a plurality of the panels. The selective treatment of the panel top and bottom surfaces provides selective interruptions in the vertical conductors. A circuit panel precursor having the through conductors and methods of making the same are also provided.

24 Claims, 19 Drawing Sheets

U.S. PATENT DOCUMENTS

| | | |
|---|---|---|
| 3,606,677 | 9/1971 | Ryan . |
| 3,616,532 | 11/1971 | Beck . |
| 3,739,469 | 6/1973 | Dougherty, Jr. . |
| 3,775,844 | 12/1973 | Parks . |
| 3,795,037 | 3/1974 | Luttmer . |
| 3,795,047 | 3/1974 | Abolafia et al. . |
| 3,829,601 | 8/1974 | Jeannotte . |
| 3,859,711 | 1/1975 | McKiddy . |
| 3,862,790 | 1/1975 | Davies et al. . |
| 4,024,629 | 5/1977 | Lemoine et al. . |
| 4,211,603 | 7/1980 | Reed . |
| 4,216,350 | 8/1980 | Reid . |
| 4,249,302 | 2/1981 | Crepeau . |
| 4,383,363 | 5/1983 | Hayakawa et al. . |
| 4,394,712 | 7/1983 | Anthony . |
| 4,452,847 | 6/1984 | Siemon . |
| 4,479,991 | 10/1984 | Thompson . |
| 4,511,757 | 4/1985 | Ors et al. . |
| 4,642,889 | 2/1987 | Grabbe . |
| 4,712,161 | 12/1987 | Pryor et al. . |
| 4,720,470 | 1/1988 | Johnson . |
| 4,727,633 | 3/1988 | Herrick . |
| 4,729,809 | 3/1988 | Dery et al. . |
| 4,740,414 | 4/1988 | Shaheen . |
| 4,755,911 | 7/1988 | Suzuki . |
| 4,788,766 | 12/1988 | Burger et al. . |
| 4,793,814 | 12/1988 | Zifcak et al. . |
| 4,817,280 | 4/1989 | Ozaki . |
| 4,868,980 | 9/1989 | Miller, Jr. . |
| 4,915,795 | 4/1990 | McKiel Jr., et al. . |
| 4,935,584 | 6/1990 | Boggs . |
| 4,954,878 | 3/1990 | Fox et al. . |
| 4,970,106 | 11/1990 | DiStefano et al. . |
| 5,001,605 | 3/1991 | Savagian et al. . |
| 5,046,238 | 9/1991 | Daigle et al. . |
| 5,069,628 | 12/1991 | Crumly . |
| 5,072,075 | 12/1991 | Lee et al. . |
| 5,089,880 | 2/1992 | Meyer et al. . |
| 5,121,299 | 6/1992 | Frankeny et al. . |
| 5,128,831 | 7/1992 | Fox, III et al. . |
| 5,129,142 | 7/1992 | Bindra et al. . |
| 5,140,745 | 8/1992 | McKenzie, Jr. . |
| 5,147,210 | 9/1992 | Patterson et al. . |
| 5,282,312 | 2/1994 | Di Stefano et al. . |

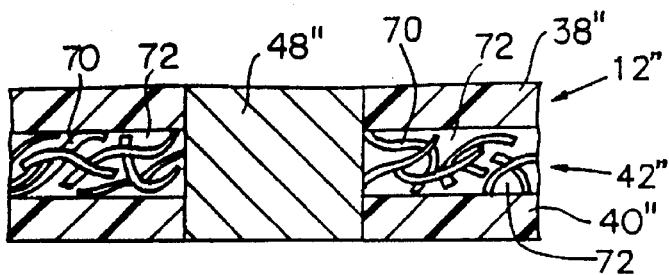
FIG. 8
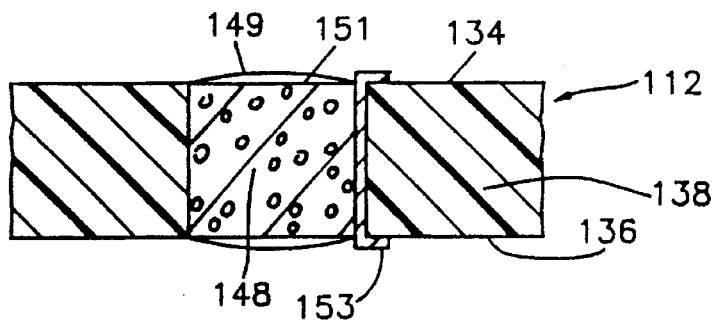
FIG. 9
FIG. 10
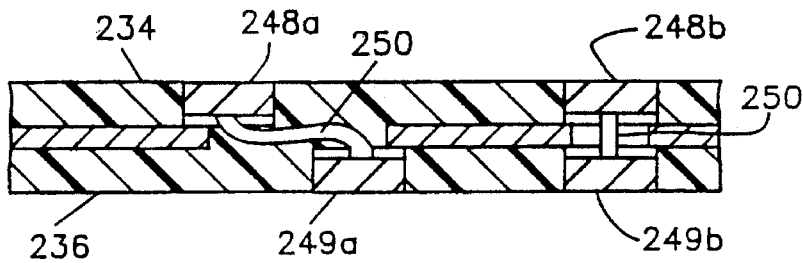
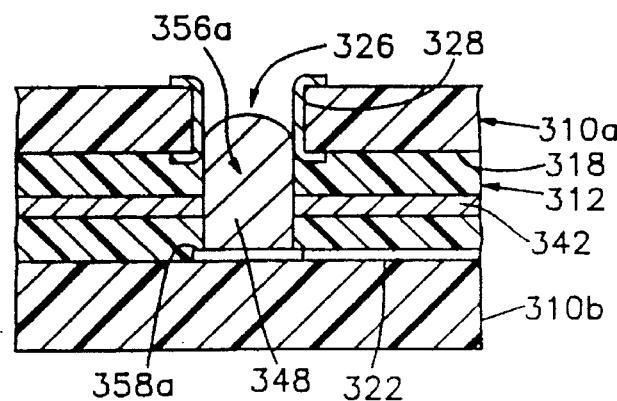
FIG. 11
FIG. 12
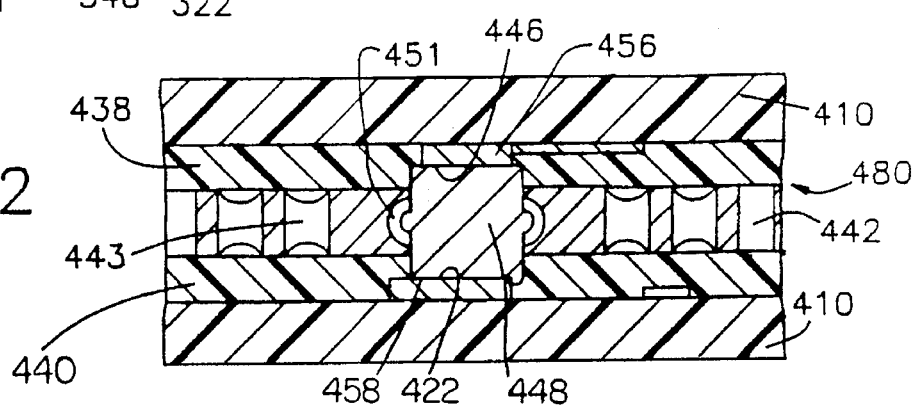

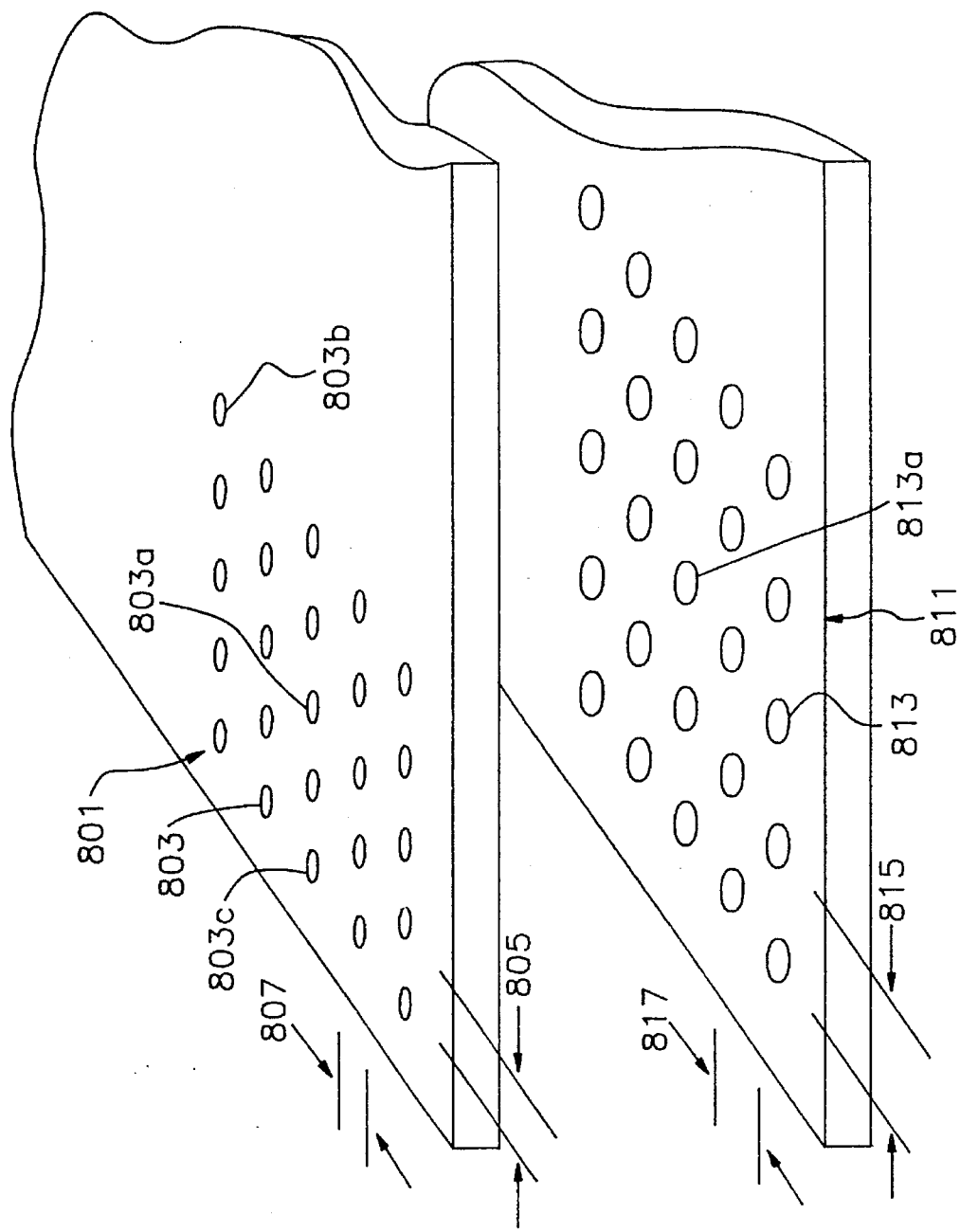

MULTI-LAYER CIRCUIT CONSTRUCTION METHOD AND STRUCTURE

This is a division of application Ser. No. 08/105,641 filed Aug. 12, 1993 which is a divisional of application Ser. No. 07/816,634 filed on Dec. 31, 1991, now U.S. Pat. No. 5,282,312.

FIELD OF THE INVENTION

The present invention relates to the field of electrical circuitry, and more particularly relates to multi-layer circuit structures such as multi-layer circuit boards, to components and methods utilized in fabrication of such structures and to methods of making the same.

BACKGROUND OF THE INVENTION

Electrical components are commonly mounted on circuit panel structures such as circuit boards. Circuit panels ordinarily include a generally flat sheet of a dielectric material with electrical conductors disposed on a major, flat surface of the panel or on both major surfaces. The conductors are commonly formed from metallic materials such as copper and serve to interconnect the electrical components mounted to the board. Where the conductors are disposed on both major surfaces of the panel, the panel may have additional conductors extending through the dielectric layer so as to interconnect the conductors on opposite surfaces. Multi-layer circuit board assemblies have been made heretofore which incorporate plural, stacked circuit boards with additional layers of dielectric materials separating the conductors on mutually facing surfaces of adjacent boards in the stack. These multi-layer assemblies ordinarily incorporate interconnections extending between the conductors on the various circuit boards in the stack as necessary to provide the required electrical interconnections.

Electrical components which can be mounted to circuit panel structures include so-called "discrete" components and integrated circuits which include numerous components in a single chip. Chips of this nature can be mounted on elements commonly referred to as "chip carriers" which are specialized circuit panel structures. A chip carrier may be incorporated in a package which is mounted to a larger circuit board and interconnected with the remaining elements of the circuit. Alternatively, the chip can be mounted directly to the same circuit panel which carries other components of the system. This arrangement is ordinarily referred to as a "hybrid circuit". Relatively large circuit panels are commonly made of polymeric materials, typically with reinforcement such as glass, whereas very small circuit panels such as those used as semiconductor chip carriers may be formed from ceramics, silicon or the like.

There have been increasing needs for circuit panel structures which provide high density, complex interconnections. The needs have been particularly acute in the case of circuit panel structures for use as chip carriers or in hybrid circuits, but are also felt in other applications. These needs are addressed by multilayer circuit panel structures. The methods generally used to fabricate multi-layer panel structures have certain serious drawbacks. Multi-layer panels are commonly made by providing individual, dual sided circuit panels with appropriate conductors thereon. The panels are then stacked one atop the other with one or more layers of uncured or partially cured dielectric material, commonly referred to as "prepregs" disposed between each pair of adjacent panels. Where an electrically conductive ground plane is desired between adjacent panels, the same may be formed by a layer of foil disposed between two prepregs, the foil and the prepreg being disposed between adjacent panels in the stack. Such a stack ordinarily is cured under heat and pressure to form a unitary mass. After curing, holes are drilled through the stack at locations where connections between different boards are desired. The resulting holes are then coated or filled with electrically conductive materials, typically by plating the interiors of the holes.

It is difficult to drill holes with a high aspect ratio or ratio of depth to diameter. The drills used to form the holes tend to deviate from a straight path as they pass through the various layers, leading to inaccuracies in placement of the holes. Moreover, there is always some misalignment between the various boards in the stack. Tolerance zones must be provided around the intended location of each hole in each panel to compensate for these factors. Small drills are prone to breakage and hence there is a practical lower limit on hole size. Additional difficulties are encountered in depositing conductive material within small holes of high aspect ratio. For all of these reasons, the holes used in assemblies fabricated according to these methods must be relatively large and hence consume substantial amounts of space in the assembly. Moreover, these holes necessarily extend from the top or bottom of the stack. Therefore, even where interconnections are not required in the top or bottom layers, space must be provided for holes to pass through these layers so as to provide needed interconnections in the middle layers. Accordingly, substantial amounts of the available surface area on the panels must be allocated to the holes and to accommodate the tolerance zones ground the holes. Moreover, the electrical interconnections formed by depositing conductive materials in such drilled holes tend to be weak and susceptible to failures induced by stresses encountered in service, including stresses caused by differential thermal expansion of the dielectric and conductive materials. The drilling method and the general nature of the laminates used therein is described, for example in Doherty, Jr., U.S. Pat. No. 3,793,469; and Guarracini, U.S. Pat. No. 3,316,618. Various alternative approaches have been proposed.

Parks et al., U.S. Pat. No. 3,541,222; Crepeau, U.S. Pat. No. 4,249,032; Luttmer, U.S. Pat. No. 3,795,037; Davies et al., U.S. Pat. No. 3,862,790 and Zifcak, U.S. Pat. No. 4,793,814 all relate generally to structures which have metallic or other conductive elements arranged at relatively closely spaced locations on a dielectric sheet with the conductive elements protruding through the dielectric sheet in both directions. Such a sheet may be sandwiched between a pair of circuit boards and the circuit boards may be clamped or otherwise held together so as to provide mechanical interengagement between conductive elements on the adjacent faces of the circuit boards and the conductive elements of the composite sheet. In each of these arrangements, the conductive elements, the composite sheet or both is resilient or malleable so as to provide for close interengagement between the conductive elements of the composite sheet and the conductors on the circuit boards. Although these arrangements provide interconnections of a fashion without drilling, they suffer from serious drawbacks including the need for extraneous mechanical elements to hold the assembly together, and limited reliability.

Beck, U.S. Pat. No. 3,616,532 describes a variant of this approach in which small coil springs coated with a fusible solder are mounted in insulating boards which are then stacked between printed circuit layers. The assembly is heated so as to melt the solder, thereby freeing the springs to expand into engagement with the conductors on adjacent boards so that the spring and solder cooperatively form an interconnection between the adjacent circuit boards. Dube et al., U.S. Pat. No. 3,509,270 utilizes a similar approach to connection of the two layers on opposite sides of the same circuit board, but in this case the spring may be allowed to expand through a layer of bonding material which holds the conductive layers to the opposite sides of the central board.

Dery et al., U.S. Pat. No. 4,729,809 discloses the use of an anisotropically conductive adhesive material disposed between opposing sublaminates, the adhesive composition having sufficient conductivity across the relatively small spaces between conductors on adjacent layers to form an electrical interconnection therebetween, but having low conductivity across the relatively large spaces between adjacent conductors on the same surface so that it does not produce an unwanted lateral interconnection along one surface. Boggs, U.S. Pat. No. 4,935,584 discloses an approach using multiple sublaminates or sheets, each having conductors on it and each having through holes. These sheets are laminated to one another in such fashion that some of the through holes are aligned with one another and conductive material is introduced into the aligned through holes to form a conductor extending in the vertical direction, between the various vertical levels of the assembly. Lemoine et al., U.S. Pat. No. 4,024,629 illustrates a generally similar approach in a multi-layer assembly of the types made from ceramic materials.

Phohofsky, U.S. Pat. No. 3,214,827 describes a technique in which plural circuit layers are stacked with apertures in the various layers being aligned, and an interconnecting element is physically advanced into the aligned apertures to form a vertical interconnect. Parks, U.S. Pat. No. 3,775,844 uses a multi-layer structure with interconnecting wafers some of which provide "z" access or vertical interconnections, the plural wafers in the stack being held together either by pressure or by fusing.

Pryor et al., U.S. Pat. No. 4,712,161 forms a multi-layer ceramic bodied circuit assembly with copper conductors on opposite sides of one element and with an interposer or vertical connector structure having solder or solid wire extending between opposite faces. The conductor bearing and vertical connection structures are stacked one atop the other so that the conductors are engaged with the vertical connections in the vertical connection structures. Each such structure has a layer of a fusible glass on its major surfaces. These structures are stacked and subjected to heat and pressure so that the fusible glass on the surfaces of the abutting structures, apparently with additional fusible glass interposed between these surfaces, fuse to join the entire assembly into a unitary multi-layer device. Jeannotte et al., U.S. Pat. No. 3,829,601 provides a multi-layer structure with the vertical interconnections formed by posts protruding vertically from the surfaces of the various layers, the posts being aligned with one another and bonded to one another by a metallurgical diffused interface. A separate insulating layer is disposed between the circuit bearing layers to insulate these from one another.

Berger et al., U.S. Pat. No. 4,788,766 uses conductor bearing circuit lamina having hollow, eyelet-like via structures, each such via structure having a rim protruding vertically from the surrounding structure. Each such via structure is provided with a thin layer of a conductive bonding material. In making the multi-layer structure, dielectric bonding films are interposed between the circuit bearing lamina. The dielectric films have apertures in locations corresponding to the locations of the eyelet structures, in the adjacent circuit bearing lamina. Thus, the upstanding rims of the eyelet structures can bear upon one another when the assembly is forced together under heat and pressure. The layers of conductive bonding material on the rims of the abutting eyelets are said to form bonds between the abutting eyelets structures. The dielectric bonding layer must necessarily be quite thin and the dielectric bonding layer must also have the holes in it at the specific locations required to form the interconnections. Further, each of these holes must be substantially larger than the eyelet rims. The tolerance of this system for deviations from planarity or paralleling, for misalignment between lamina and for misalignment between the lamina and the dielectric bonding films is limited. Moreover, only surface or point bonds are formed between abutting eyelet rims which tends to limit the strength of the vertical interconnections.

Ryan, U.S. Pat. No. 3,606,677 discloses a technique for making a multi-layer circuit board which relies upon controlled viscosity and flow characteristics of an adhesive bonding agent between layers to prevent the adhesive from penetrating into through holes within the layers. Abolafia et al., U.S. Pat. No. 3,795,047 uses circuit bearing laminates have epoxy coated thereon in a pattern corresponding to the pattern of the vertical interconnects. Conductive spherical particles are applied and held on this epoxy and form junctions with opposing layers when multiple layers are pressed together. Reid, U.S. Pat. No. 4,216,350 and Grabbe, U.S. Pat. No. 4,642,889 utilize sheet like interposers having multiple holes extending through them. Such holes are filled or partially filled with solder, with or without additional conductive material such as wire, and the interposer is then disposed between components to be connected and heated so as to form a plurality of soldered joints simultaneously. Bohrer et al., U.S. Pat. No. 3,077,511 utilizes a similar approach for connecting multiple layers of a printed circuit. In this case, the solder bearing interposer includes a dielectric film which apparently remains in place after the solder is fused.

Despite all of these efforts toward manufacture of multi-layer laminar electrical circuits, there have still been needs for further improvements in such circuits and in the materials and components used to manufacture the same.

THE LAMINATION TECHNIQUE INVENTION

As further discussed below, preferred embodiments of the present invention utilize materials and techniques disclosed and claimed in the co-pending, commonly assigned U.S. patent application entitled, "Multi-Layer Circuit Structures, Methods of Making Same and Components for Use Therein" of Thomas H. DiStefano et al, filed on the same date as the present application. Said U.S. patent application names two of the present inventors together with Scott G. Ehrenberg. Said U.S. patent application is referred to herein as the "contemporaneous joint application." The subject matter set forth in the contemporaneous joint application is referred to herein as the "lamination technique invention." As the lamination technique invention can be, and most preferably is, utilized in certain preferred embodiments of the present invention, the teachings of the contemporaneous joint application are incorporated at length hereinbelow to facilitate understanding of the present invention.

One aspect of the lamination technique invention provides methods of making multi-layer circuit assemblies. These methods employ a plurality of circuit panels, each having one or more electrical conductors thereon and each having electrically conductive material at preselected interconnect locations on at least one major surface. The method also utilizes one or more generally sheetlike interposers each having preselected interconnect locations on both major surfaces and electrically conductive elements extending between interconnect locations on opposite surfaces. The interposer has a flowable dielectric material on its major surfaces except at its interconnect locations. At least some of the electrically conductive material on the circuit panels, on the interposers, or both at their respective interconnect locations may be flowable. A method according to this aspect of the lamination technique invention preferably includes the step of stacking the circuit panels and interposers in superposed relation so that each interposer is disposed between two circuit panels, with the major surfaces of the interposers and circuit panels confronting one another, and with interconnect locations on the confronting surfaces of the circuit panels and interposers being aligned with one another. The method most preferably further includes the step of causing the flowable dielectric material to flow and conform to the major surfaces of the circuit panels. The method desirably includes the step of causing the flowable conductive material to flow and join the conductive material on the circuit panels and on the interposers into continuous electrical conductors extending between adjacent circuit panels at their respective interconnect locations. Most preferably, the flowable dielectric and flowable conductive materials are caused to flow concomitantly with one another in a single step involving application of heat and pressure to the stacked circuit panels and interposers.

The flowable dielectric material on the interposers fills in irregularities on the major surfaces of the circuit panels. In particular, where the circuit panels have electrical conductors extending along their major surfaces these often formed as raised strips on the panel surface. The flowable dielectric material fills the spaces between these raised strips, so that each strip is fully surrounded by solid dielectric material after the fabrication procedure. This protects the conductors on the circuit panels from atmospheric effects such as corrosion and also eliminates undesirable electrical effects and structural problems resulting from air voids or pockets adjacent the conductors.

The electrically conductive elements carried by the interposers form parts of the electrical connections between adjacent circuit panels. Most preferably, the conductive elements of each interposer are brought into abutting or juxtaposed relation with the conductive materials of the adjacent circuit panels at each interconnect location before the dielectric material is caused to flow. The use of conductive material on the interposers to form conductive paths between adjacent circuit board allows the use of interposers having substantial thickness.

Each interposer most desirably includes a generally sheetlike interior element and flowable dielectric material on opposite surfaces of such interior element. The interior element desirably is adapted to remain dimensionally stable throughout the process, and hence reinforces the interposers against undesired dimensional changes in directions parallel to the planes of the circuit panels. The interior element may incorporate an electrically conductive structure which serves to define a potential plane such as a ground plane in the finished assembly. The interior element of each interposer may include a porous structure such that flowable dielectric material can be forced into the interior volume of the porous structure when the dielectric material is in its fluid state. Thus, the porous structure can absorb excess flowable dielectric materials. As further discussed below, this allows the interposers to compensate for uneven circuit panel thicknesses and variations in the number of raised conductive strips on different areas of the circuit panels.

A further aspect of the lamination technique invention provides additional methods of making multilayer circuit assemblies. These methods also utilize a plurality of circuit panels each having at least one electrical conductor thereon and each having electrically conductive material at preselected interconnect locations on at least one major surface. These methods also use at least one generally sheetlike interposer as aforesaid. The interposers and circuit panels are stacked so that each interposer is disposed between a pair of adjacent circuit panels with the major surfaces of the interposers and circuit panels confronting one another. The stacking step includes the step of aligning the interconnect locations of each interposer surface with the interconnect locations on the confronting circuit panel surface to thereby form sets of aligned interconnect locations, each such set including interconnect locations on two circuit panels and on both surfaces of the interposer disposed therebetween. Thus, each such set of aligned interconnect locations includes the conductive material of one conductive element on the interposer, and the conductive material of one interconnect location on each of the adjacent circuit panels. At least some of the conductive material in each set of aligned interconnect locations is flowable. Methods according to this aspect of the lamination technique invention preferably include the step of causing the flowable conductive material to flow so as to join the conductive material in each set of aligned interconnect locations into a continuous electrical conductor extending between adjacent circuit panels. Most preferably, these methods include the step of capturing excess flowable electrically conductive material at at least of some sets of aligned interconnect locations, and preferably at each such set, in at least one reservoir within at least one of the circuit panels or within the interposer.

Most preferably, some of the stacked elements (the circuit panels and the interposers) have hollow, tubular passageways or vias extending into them from their major surfaces at the interconnect locations, and have conductive material disposed in each such via. The other, mating elements preferably have masses of flowable conductive material exposed at their interconnect locations. The space within the vias may provide the reservoirs for capturing excess flowable conductive material. In a particularly preferred arrangement, the vias are provided in the circuit panels, and the conductive material extending into the vias may be in the form of a hollow, tubular metallic shell lining each of the vias. In at least some of these locations, the via, and the conductive material disposed therein may extend entirely through the circuit panel so that the conductive material within the via interconnects conductors on opposite major surfaces of the circuit panel. Where the vias are formed in the circuit panels, the interposers may have holes extending between interconnect locations on opposite major surfaces. A conductive element in the form of a unitary mass of flowable conductive material may be disposed within each such hole. In the assembly process, the conductive material of each such unitary mass may flow into the vias of circuit panels disposed on opposite major surfaces of the interposer, thereby joining the conductive material in both such vias into a unitary electrical conductor.

Because the flowable conductive material at the interconnect locations can be provided in excess, and any excess will be taken up within the reservoirs, the flowable conductive material can assure reliable connections between the circuit panels even where the circuit panels deviate somewhat from precise planarity. Also, the flowable conductive material can form substantial, low resistance, reliable electrical connections even where there is substantial deviation from exact, precise alignment of the interconnection locations on the various circuit panels and interposers.

The most preferred methods according to the lamination technique invention combine the features of both aspects of the invention discussed above.

Further aspects of the lamination technique invention provide interconnection and bonding interposers for making electrical circuit assemblies. These interposers preferably include a generally lamellar, sheetlike or planar body having a pair of oppositely facing major surfaces and interconnect locations on both major surfaces, there being electrically conductive elements extending through the body between interconnect locations on opposite major surfaces. The body includes a flowable dielectric material distributed over the major surfaces except at the interconnect locations. The flowable dielectric material may be disposed in layers substantially covering each major surface of the body except at interconnect locations. The body may include an interior element disposed between the major surfaces, such as a sheetlike electrically conductive potential plane element or an aperture, porous element having apertures adapted to take up the flowable dielectric material when the flowable dielectric material is in its fluid state. The flowable dielectric material may be a material such as a thermosetting polymer, thermoplastic polymer, an unreacted or partially reacted polymer precursor or combinations thereof. The flowable dielectric material desirably is an adhesive material. The conductive elements extending through the body of the interposer desirably include a flowable electrically conductive material, the flowable conductive material being exposed at each major surface of the interposer. The flowable conductive material may be a wholly metallic material such as a solder or else may include a non-metallic material. Interposers according to this aspect of the present invention can be utilized in the methods discussed above with reference to the lamination technique.

SUMMARY OF THE PRESENT INVENTION

One aspect of the present invention provides methods of making a multi-layer circuit assembly. A method according to this aspect of the present invention preferably includes the step of providing a plurality of circuit panels which include a first circuit panel having a dielectric body with oppositely directed top ad bottom major surfaces. This first circuit panel has contacts on its top surface at locations of a first pattern, terminals on its bottom surface and through-conductors electrically connected to the terminals. These through conductors extend to the top surface of the panel. The plurality of circuit panels utilized in the method also includes a second circuit panel having a dielectric body with a bottom surface. The second circuit panel has terminals at locations of the aforementioned first pattern on the bottom of the panel. In the step of providing these circuit panels, the first circuit panel is customized by selectively treating the top surface of this panel so that less than all of the through conductors of the first circuit panel are connected to contacts of such panel.

The method preferably includes the steps of stacking the first and second circuit panels in superposed, top surface to bottom surface relation so that the top surface of the first panel faces the bottom surface of the second panel at a first interface therebetween, and so that the first patterns on the facing surfaces are in registration with one another. Accordingly, the contacts of the first panel are aligned with the terminals of the second panel at at least some, and typically all, locations of the in-registration patterns. The method further includes the step of nonselectively connecting all of the aligned contacts and terminals at said first interface. That is, the connecting step is conducted so that wherever a contact of the first panel is aligned with a terminal of the second panel, such contact and terminal are electrically connected to one another. Those through conductors of the first panel which happen to be connected to contacts of the first panel on the top surface thereof will be electrically connected to the terminals on the bottom surface of the second panel. However, because less than all of the through conductors on the customized first circuit panel are electrically connected to contacts of that panel, less than all of the through conductors in the first panel will be connected to the terminal on the second panel.

Preferably, the dielectric body of the second circuit panel is a generally sheet-like or plate-like structure having a top surface directed oppositely from but generally parallel to the bottom surface. The second circuit panel most preferably has through conductors electrically connected to at least some, and preferably all, of the terminals on the bottom surface of such panel. These through conductors extend to the top surface of the second circuit panel. Thus, those through conductors of the first circuit panel which are joined to contacts on the first circuit panel and hence to terminals on the bottom surface of the second circuit panel, will be joined with the through conductors of the second circuit panel and merged to form a continuous electrical conductor extending through the two panels. Such conductors are commonly referred to as "vertical" or "Z-direction" conductors.

Whether or not a particular through conductor of the first circuit panel is joined with a through conductor of the second circuit panel depends entirely upon whether or not the through conductor of the first circuit panel is connected to one of the contacts on the top surface of the first circuit panel. That in turn is controlled by the selective treatment applied to the top surface of the first circuit panel. Accordingly, methods according to this aspect of the invention provide for selective control of interconnections in the vertical direction by the selective treatment of the circuit panel top surface. Techniques for selectively treating the exposed, major surfaces of circuit panels are well developed. These techniques can be readily applied in volume production as well as in relatively short lead-time, low-quantity custom production. For example, the selective treatment step may include processes such as photo-etching, selective electroplating, laser ablation and the like. The same selective treatment step can be used to selectively connect the through conductors to elongated surface electrical conductors extending along the top surface, the bottom surface, or, preferably, both such surfaces of each panel. Indeed, the selective treatment step may also involve formation of the surface conductors. In a particularly preferred arrangement, the step of providing such circuit panels includes the step of providing circuit panel precursors, each having the through conductors formed therein and each having a layer of electrically conductive material on each of the top and bottom surfaces. Such precursors may be provided as stock items which can be readily customized through simple treatment of their exposed top and/or bottom surfaces. There is no need for the elaborate tooling or preparation required to provide individual customized circuit panels with through conductors only at specially selected locations. The selective treatment step may include the step of providing a resist pattern on each such conductive layer then exposing such conductive layer through one or more treatment media, such as etching or further plating solutions, so that after such exposure electrically conductive material remains only at those areas not covered by the resist pattern.

In a particularly preferred arrangement, the step of nonselectively connecting the contacts on the top surface of the first panel with the terminals on the bottom surface of the second panel includes the step of placing an interposer bearing discrete masses of flowable conductive material at the interface between these panels so that the masses are disposed at all locations of the aforementioned first pattern. The flowable conductive material of each such interposer is then brought to a flowable condition, thereby fusing each contact of the first panel and the terminal of the second panel aligned therewith into a electrically conductive unitary body. Most preferably, the method includes the step of bonding the dielectric bodies of the first and second panels to one another. The interposer and bonding technique used in the preferred methods according to the present invention may include the features of the lamination technique invention. Thus, the interposer may incorporate flowable dielectric material which serves both to bond the facing surfaces of the first and second panels to one another and also to electrically insulate these surfaces from one another except at the locations of the first pattern, where the flowable conductive material is provided. A very significant benefit afforded by the preferred arrangements according to the present invention is that the interposer need not be customized. That is, the interposer may be a standard item having flowable conductive material at every location of the first pattern. If a through conductor of the first panel is connected to a contact lying at a particular location of the first pattern, that through conductor will be connected to one of the terminals of the second panel, by the flowable conductive material, and thus the through conductor of the first panel will be connected to a through conductor of the second panel. If the through conductor of the first panel is not connected to a contact at a particular location of the first pattern, the flowable conductive material will be present and will not serve to interconnect the through conductor of the first panel with a terminal or through conductor of the second panel. Again, because the vertical or "Z-direction" interconnections are controlled by the selective treatment applied to the first or top surface of the first panel, there is no need for customization of the interposer or selective placement of electrically conductive material between the panels at only those locations where vertical conductors are desired.

The preferred methods according to this aspect of the invention thus provide essentially complete freedom to customize the multilayer circuit panel assembly. In a preferred form, the methods according to this aspect of the present invention can incorporate the advantages of the lamination technique invention as well. Methods according to this aspect of the invention can be used with three or more panels. Thus, the second panel can have contacts on its top surface, and at least some (but preferably less than all) of the conductors of the second circuit panel are electrically connected to contacts on the top surface of that panel. Thus, the top surface of the second panel may be selectively treated substantially the same way as discussed above with reference to the first panel. The method desirably further includes the step of providing a third circuit panel having a dielectric body with a bottom surface and, preferably, with a top surface parallel thereto. The third panel has terminals on its bottom surface. Preferably, the contacts on the top surface of the second panel, and the terminals on the bottom surface of the third panel are disposed at locations of a second pattern.

The third panel is superposed on the second panel so that the bottom surface of the third panel faces the top surface of the second panel at a second interface, with the second patterns in registration with one another. Thus, contacts on the top surface of the second panel and terminals on the bottom surface of the third panel are aligned with one another. The so-aligned contacts and terminals at this second interface are nonselectively connected. This nonselective connection step may include an interposer as discussed above with reference to the first interface, except that the interposer used at the second interface has the electrically conductive material at locations of the second pattern. The third panel desirably has a top surface and through conductors extending from the terminals on the bottom surface of the third panel to the top surface.

Through conductors of each of the first, second and third panels may extend substantially vertically between the top and bottom surfaces of the respective panels. The stacking and superposing steps may be performed so that the through conductors of the first and third panels are aligned with one another. For example, the terminals of each panel may be defined by the bottom ends of the through conductor in such panel, as where the through conductors include vias extending into the panel with the bottom ends of the vias forming the terminals. In this case, the through conductors of the first and third panels may be disposed at locations of the second pattern, whereas the through conductors of the second panel may be disposed at locations of the first pattern. In this fashion, the assembly will have composite vertical conductors extending in a zigzag fashion through the various panels.

Each panel may have a generally sheet-like internal electrically conductive element such as a ground plane element disposed between the top and bottom surfaces of the panel. Each panel may have risers extending from such internal element to the top or bottom surface of the panel at riser locations spaced apart from the through conductors. The selective treatment step may be performed so as to leave less than all of the through conductors or surface conductors of each panel connected to the risers of such panel. Thus, less than all of the through conductors and/or less than all of the surface conductors are connected to the sheet-like internal element. Here again, essentially complete freedom of design as to which conductors, if any, are connected to the internal element or ground planes is provided, but the only customization steps necessary to provide this freedom are incorporated in the selective treatment of the panel surfaces.

A further aspect of the present invention provides multilayer circuit assemblies. A circuit assembly in accordance with this aspect of the present invention may include a plurality of circuit panels as discussed above in connection with the methods of the present invention. These panels typically include at least one panel of a first set and at least one panel of a second set. Each panel has the dielectric body with oppositely directed top and bottom surfaces and plural through conductors. Each panel has terminals on its bottom surface, each such terminal being connected to one such through conductors, and each panel has contacts on its top surface. At least some, but most preferably less than all of the contacts on the top surface of each panel are connected to the through conductors of that panel. Each panel of the first set has its contacts at at least some locations of a first pattern and has terminals at all locations of a second pattern. The panels of the second set have the reverse arrangement, i.e., they have contacts at least some locations of the second pattern and have terminals at all locations of the first pattern. The panels are superposed on one another in top surface to bottom surface facing arrangement with panels of the first and second sets arranged alternately and hence define at least interface therebetween. The first patterns of the various panels are aligned with one another and the second patterns of the various panels are also aligned with one another. Thus, the contacts of each panel are aligned with the terminals of another panel at each interface. Preferably, all of the aligned contacts and terminals are connected to one another at each interface so that at least some of the through conductors of each panel are linked by the so-connected terminals and contacts to through conductors of the other panels to form composite vertical or Z-direction conductors extending through a plurality of panels. At least one of the panels has less than all of its through conductors connected to contacts of such panel, whereby less than all of the through conductors in that panel will be connected to through conductors of the next higher panel in the stack.

Most preferably, the panels have elongated surface conductors extending along the top and bottom surfaces and there is an insulation layer at each interface separating the elongated conductors on adjacent panels from one another. The elongated surface conductors desirably extend in mutually perpendicular first and second directions along the surfaces of the panel. Most preferably, the elongated conductors on the top surface of each panel extend in a first one of said directions and the elongated conductors on the bottom surface of each panel extend in the other one of such directions. The patterns of the terminals and contacts desirably are rectilinear grids defining columns and rows, the columns being parallel to the first direction and the rows being parallel to the second direction, so that the columns and rows of contacts and terminals extend parallel to the elongated conductors on the surfaces of the panel. The through conductors in the various panels desirably extend vertically upwardly from the terminals of each such panel, so that the through conductors are disposed in the rectilinear first and second patterns. Most preferably, the first pattern and second pattern are replicates of one another but are offset from one another one of said first and second directions.

Yet another aspect of the invention provides a method of making circuit panel precursors. Methods according to this aspect of the invention desirably include the step of applying a first electrically conductive material on a surface of a first dielectric sheet so as to form islands of conductive material at spaced-apart locations on the dielectric sheet. Most preferably, the first conductive material is applied so as to form a generally continuous layer of conductive material with apertures extending through it, each island of conductive material being disposed within one such aperture. The method further includes the step of applying a second dielectric material over the first conductive material so as to provide a second dielectric sheet and thereby form a laminate with the first conductive material disposed between the two dielectric sheets. The surfaces of the sheets remote from the first conductive material form the top and bottom surfaces of the laminate. The two dielectric materials cooperatively surround each of the islands of a conductive material and insulate each island from the remainder of the first conductive material.

The method most preferably further includes the step of forming holes in each dielectric sheet so that the holes are aligned with the islands of conductive material and so that each island is exposed through the holes to the bottom and top surfaces of the laminate. The holes in the dielectric sheets may be formed by applying radiant energy to the dielectric sheets after the dielectric sheets are laminated with the conductive islands, as by applying radiant energy to the dielectric layers of opposite sides of the laminate in registration with the islands of conductive material. The method most preferably further includes the step of depositing an electrically conductive via material in the holes in the dielectric sheets so as to form through conductors extending between the top and bottom surfaces of the laminate. The via material joins with the islands of conductive material so that each through conductor includes one such island as part of the conductor. Where the conductive material is provided as a generally continuous layer with apertures, the through-conductors extend through the apertures in the continuous layer. The precursor may also be provided with an electrically conductive surface material such that the surface material is electrically connected to the through conductors. Both the via material and the surface material may be applied simultaneously, as by immersing the laminate, with the holes, in a plating solution or by sputter deposition.

Still further aspects of the present invention provide panel precursors. Precursors according to this aspect of the invention include the dielectric sheets and electrically conductive islands as discussed above. The dielectric materials of the sheets are joined with one another so that the dielectric materials surround each island and form the top and bottom surfaces of the precursor. Desirably, the precursor has holes in each dielectric layer and electrically conductive via material extending within such holes from its top and bottom surfaces to the islands so that the via material and islands form composite through conductors. Typically, the via material is in the form of hollow, tubular liners in the holes of the dielectric layers. The precursor preferably further includes surface conductive materials on the top and bottom surfaces, the conductive surface material being connected to the via materials. The via material may include a noble metal such as gold and the conductive surface material may include a noble metal portion and a base metal portion. The noble metal portion may be exposed at terminal-forming regions of the top and bottom surfaces surrounding the through conductors, and at contact-forming region separated from the terminal-forming region. Precursors according to this aspect of the present invention can be made as discussed above and can be utilized in the process of making a multi-layer circuit arrangement as discussed above. For example, the step of providing the various circuit panels can be performed by selectively etching the top and bottom surfaces of such precursors. The particular via structure incorporated in the precursor provides significant advantages. The islands of electrically conductive materials serve to reinforce the dielectric material and to prevent distortion of the holes. Moreover, the conductive islands provide additional electrically conductive material in each through conductor adjacent the vertical midpoint of the through conductor, i.e., at about the point on the through conductor midway between the top and bottom surfaces of the precursor. The conductive islands thus reinforce the through conductors at those locations where it is particularly difficult to deposit via material.

These and other objects, features and advantages of the present invention will be more readily apparent from the detailed description of the preferred embodiment set forth below, taken in conjunction with the accompanying drawings.

Figure 1:
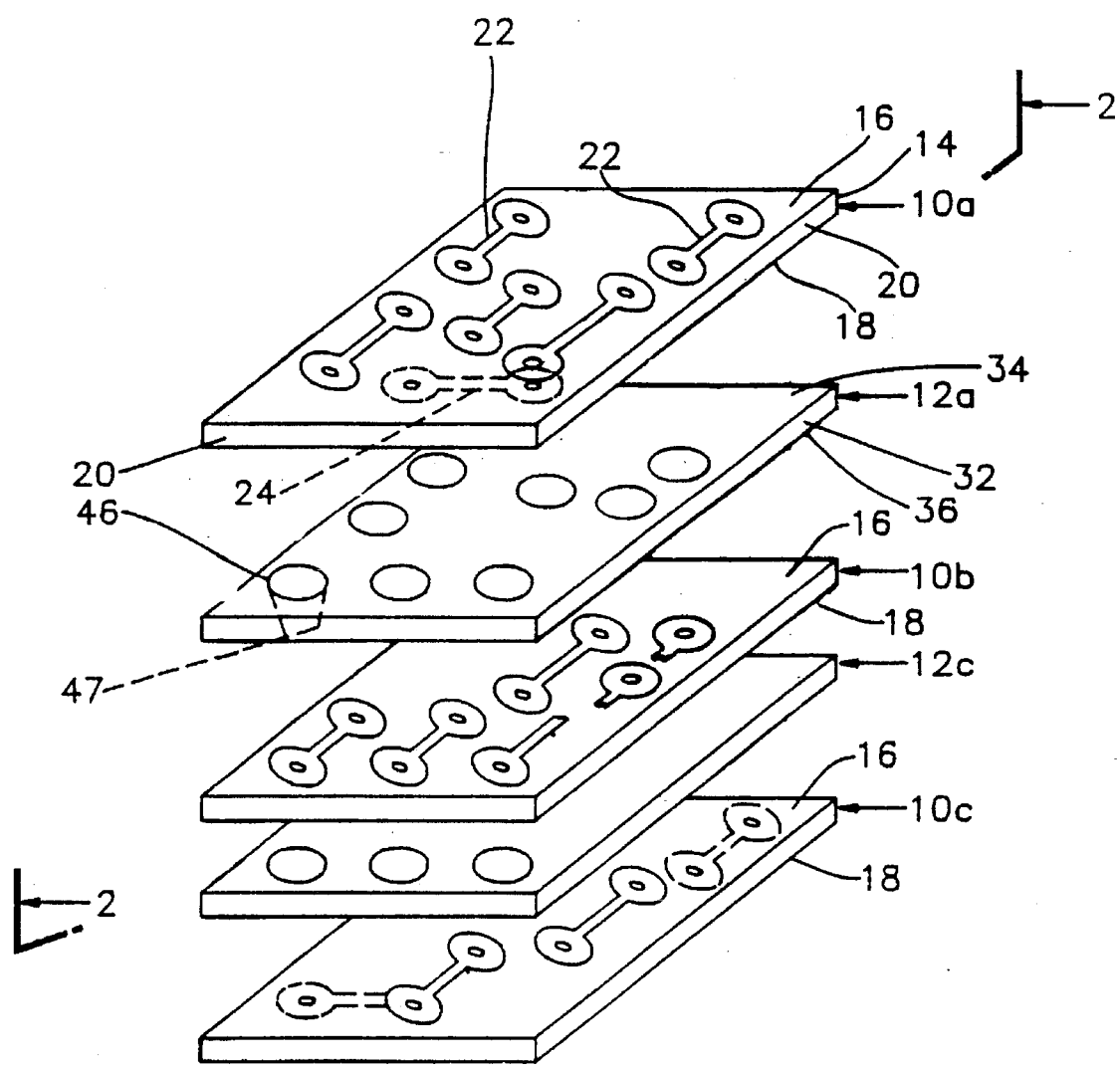
FIG. 1 is a schematic, exploded perspective view showing certain components in one stage of an assembly process according to one embodiment of the lamination technique invention.
Figure 2:
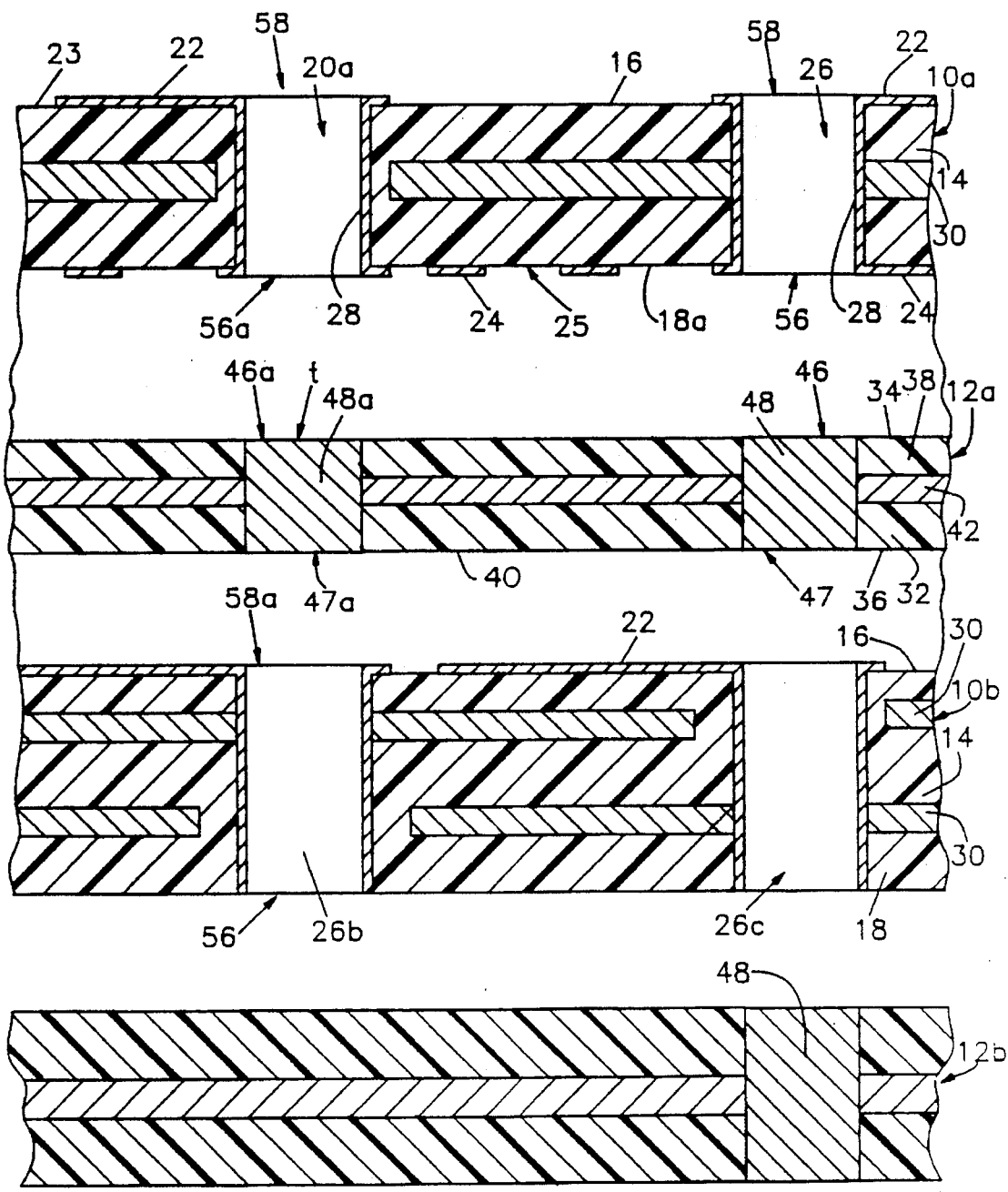
FIG. 2 is a fragmentary, diagrammatic sectional view along line 2—2 in FIG. 1.
Figure 3:
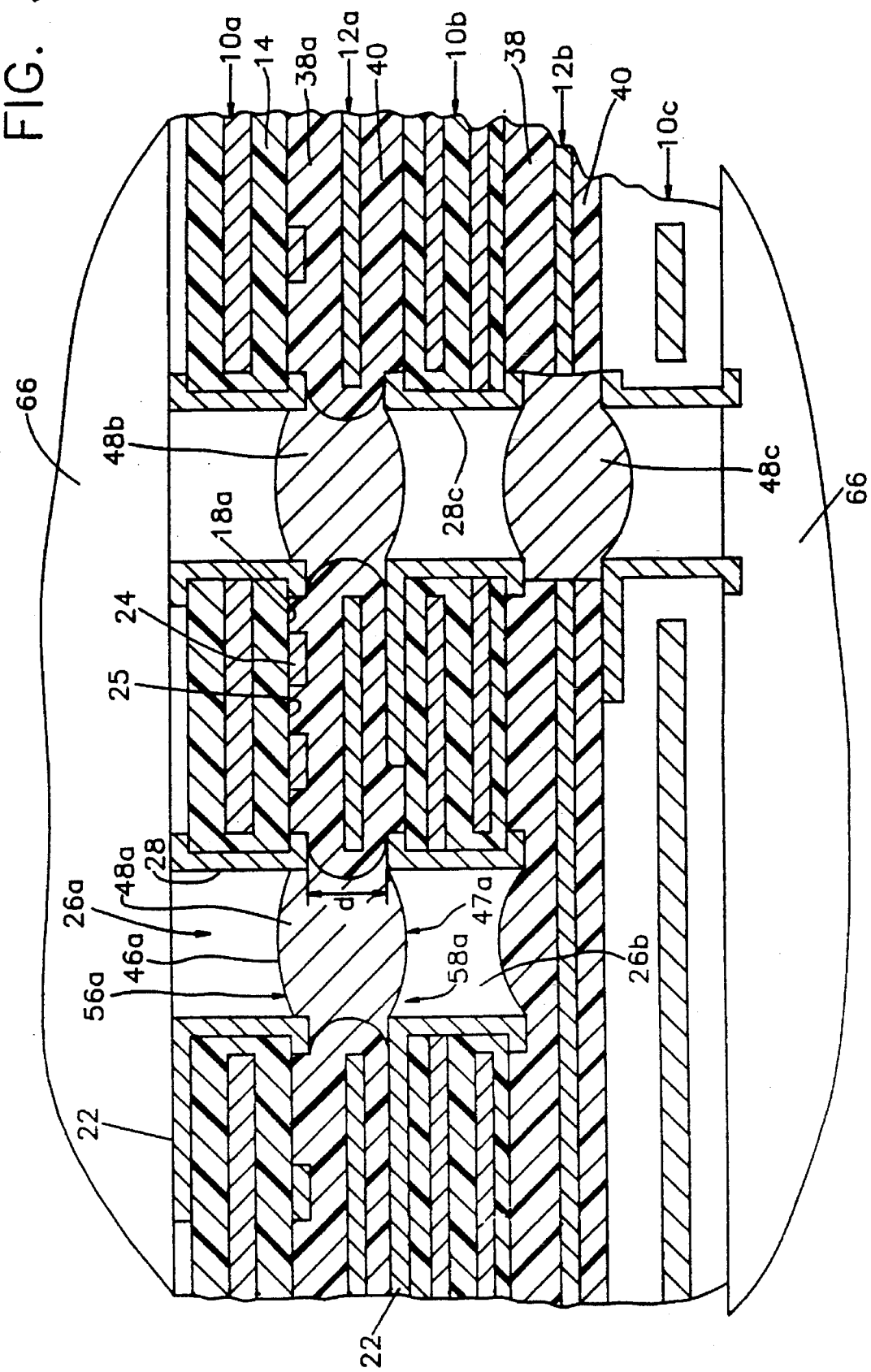
FIG. 3 is a view similar to FIG. 2 but depicting the same components at a later stage in the process.
Figure 5:
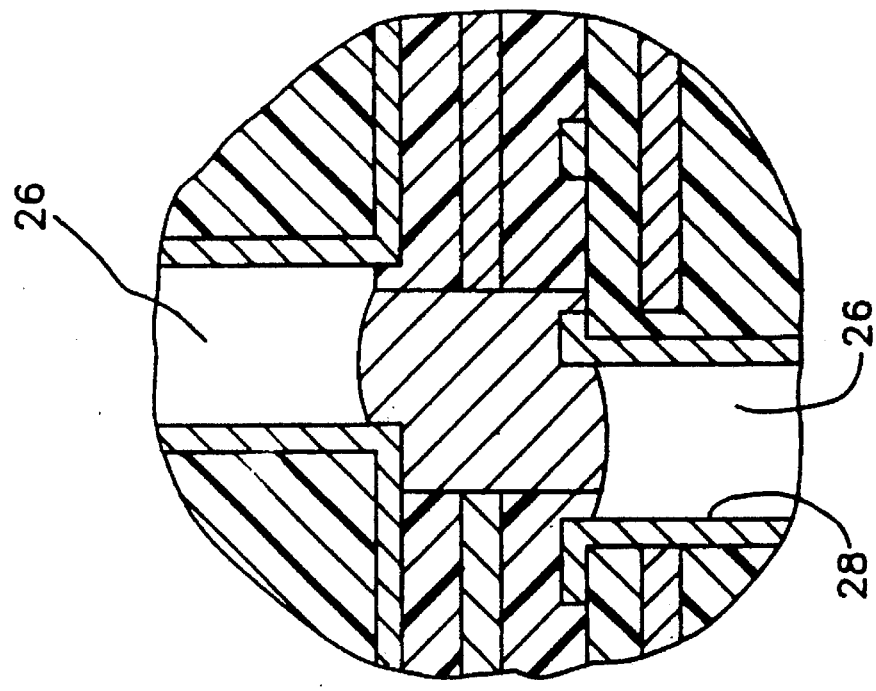
Figure 4:
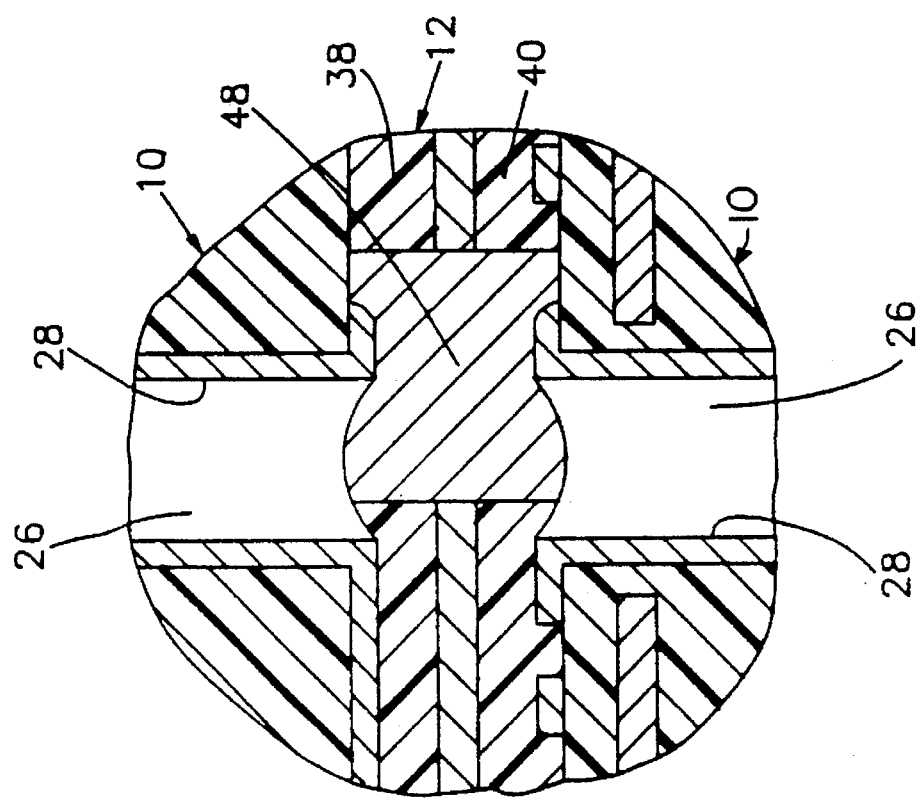

Each of FIGS. 4 and 5 are fragmentary, schematic sectional views on an enlarged scale depicting certain features of the embodiment shown in FIGS. 1–3.

Figure 6:
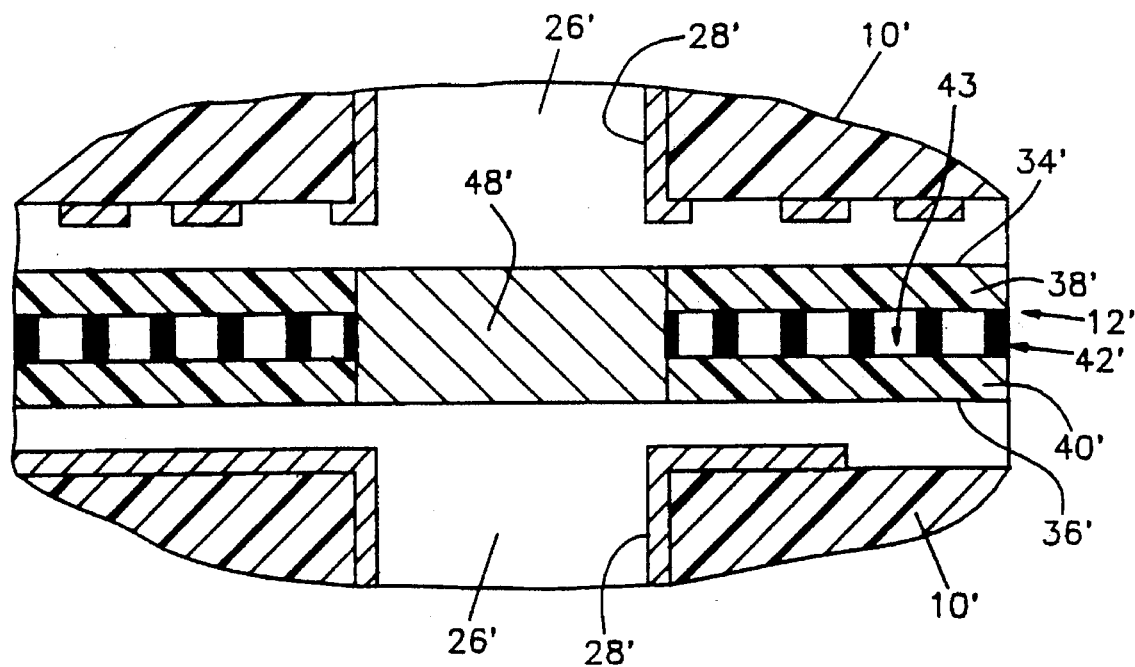

FIG. 6 is a fragmentary diagrammatic sectional view depicting components according to a further embodiment of the lamination technique invention at one stage in an assembly.

Figure 7:
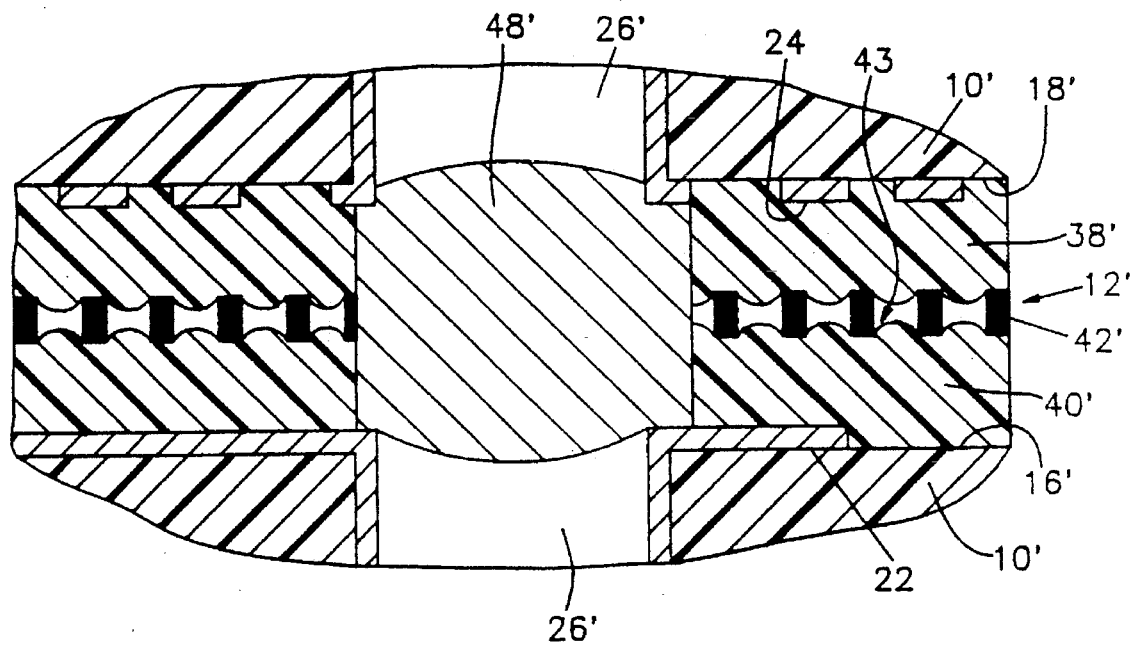

FIG. 7 is a view similar to FIG. 6 but depicting the components at a later stage in the manufacturing process.

FIG. 8 is a fragmentary diagrammatic sectional view of a component in accordance with a further embodiment of the lamination technique invention.

FIGS. 9 and 10 are views similar to FIG. 8 but depicting components in accordance with other embodiments of the lamination technique invention.

FIGS. 11 and 12 are further fragmentary diagrammatic sectional views depicting components according to yet another embodiment of the lamination technique invention.

Figure 13:
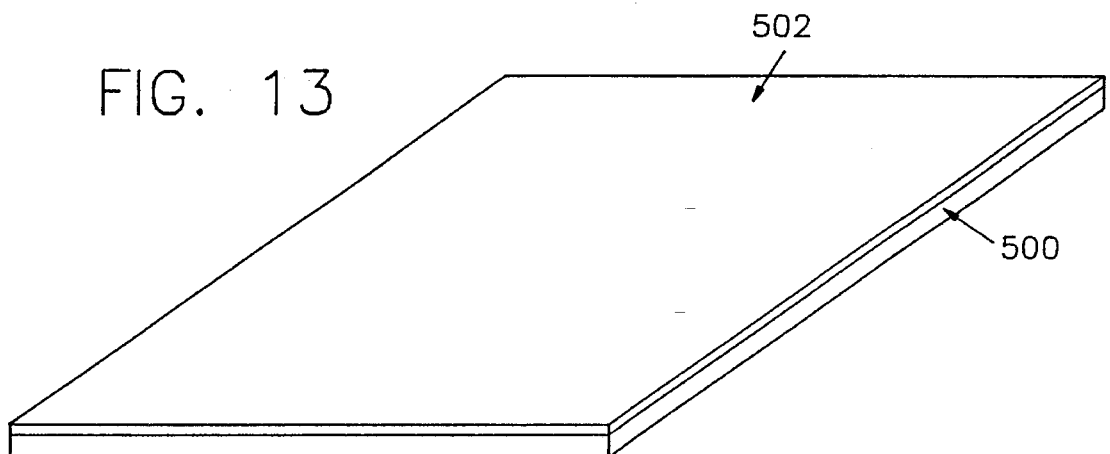
Figure 14:
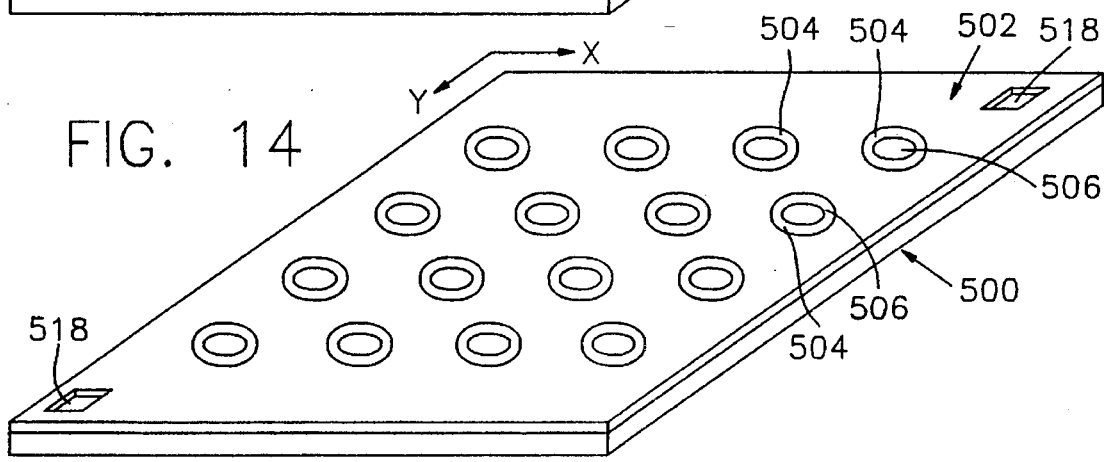

FIGS. 13 and 14 are diagrammatic perspective views depicting successive stages in a process according to one embodiment of the present invention.

Figure 15:
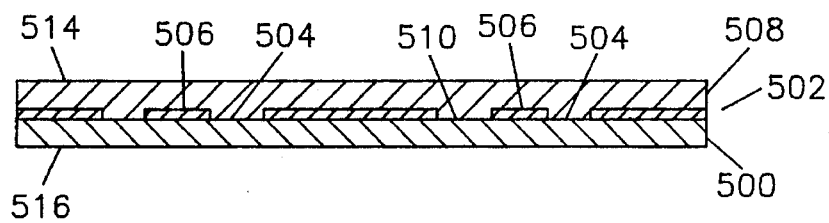

FIGS. 15 is a fragmentary, diagrammatic sectional views depicting further stages in the process of FIGS. 13–14.

Figure 16:
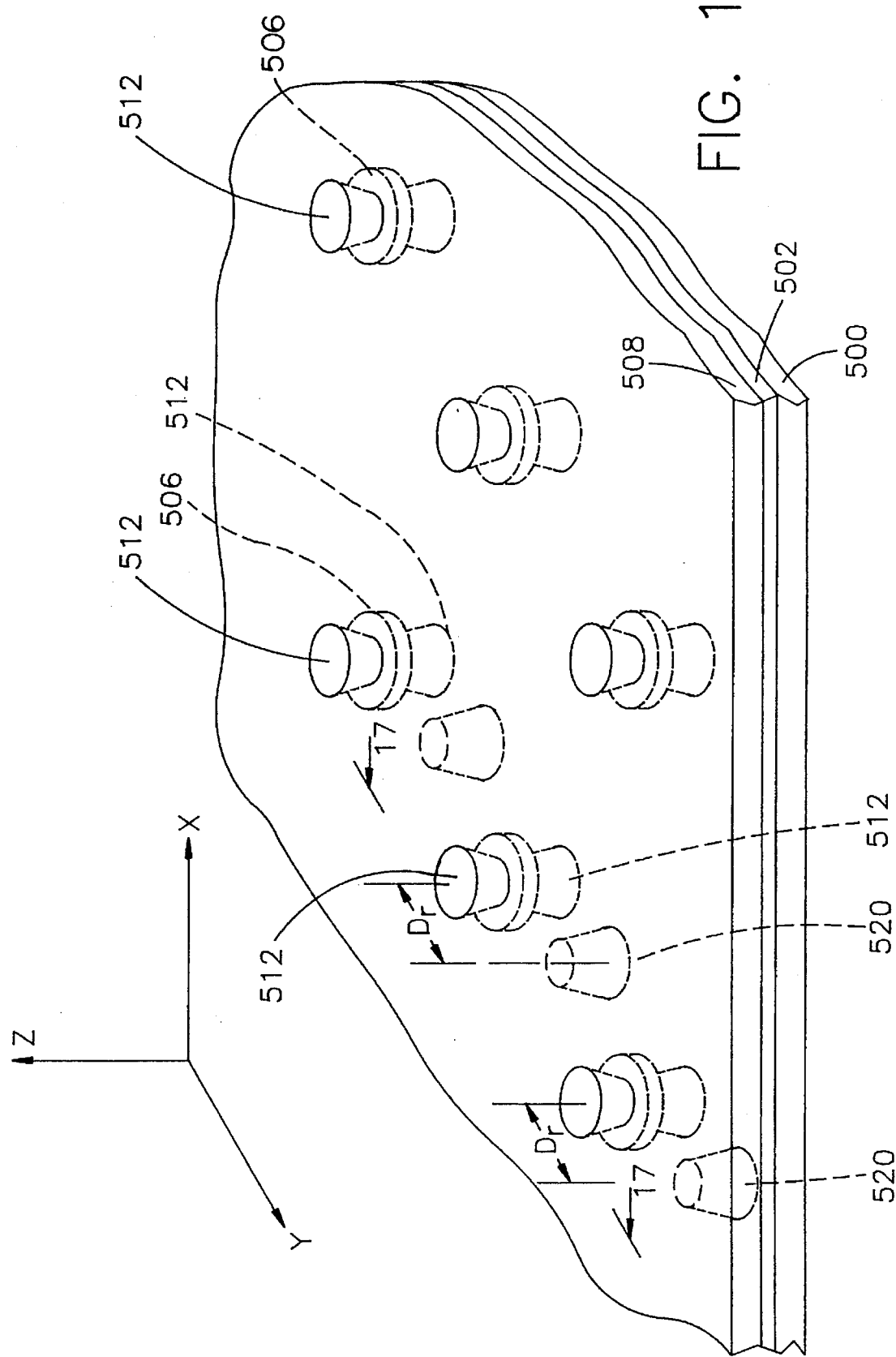

FIG. 16 is a fragmentary, diagrammatic perspective depicting a further state in the process.

Figure 17:
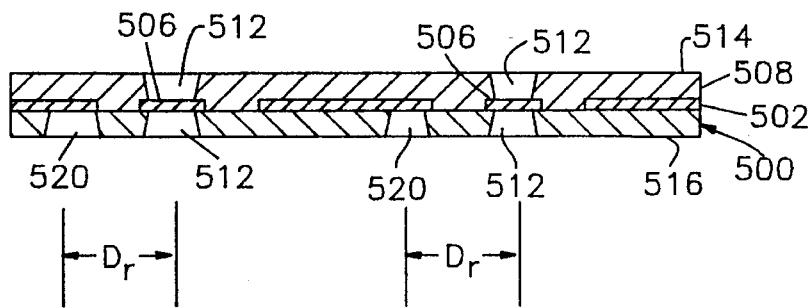

FIG. 17 is a sectional view along line 17—17 in FIG. 16.

Figure 18:
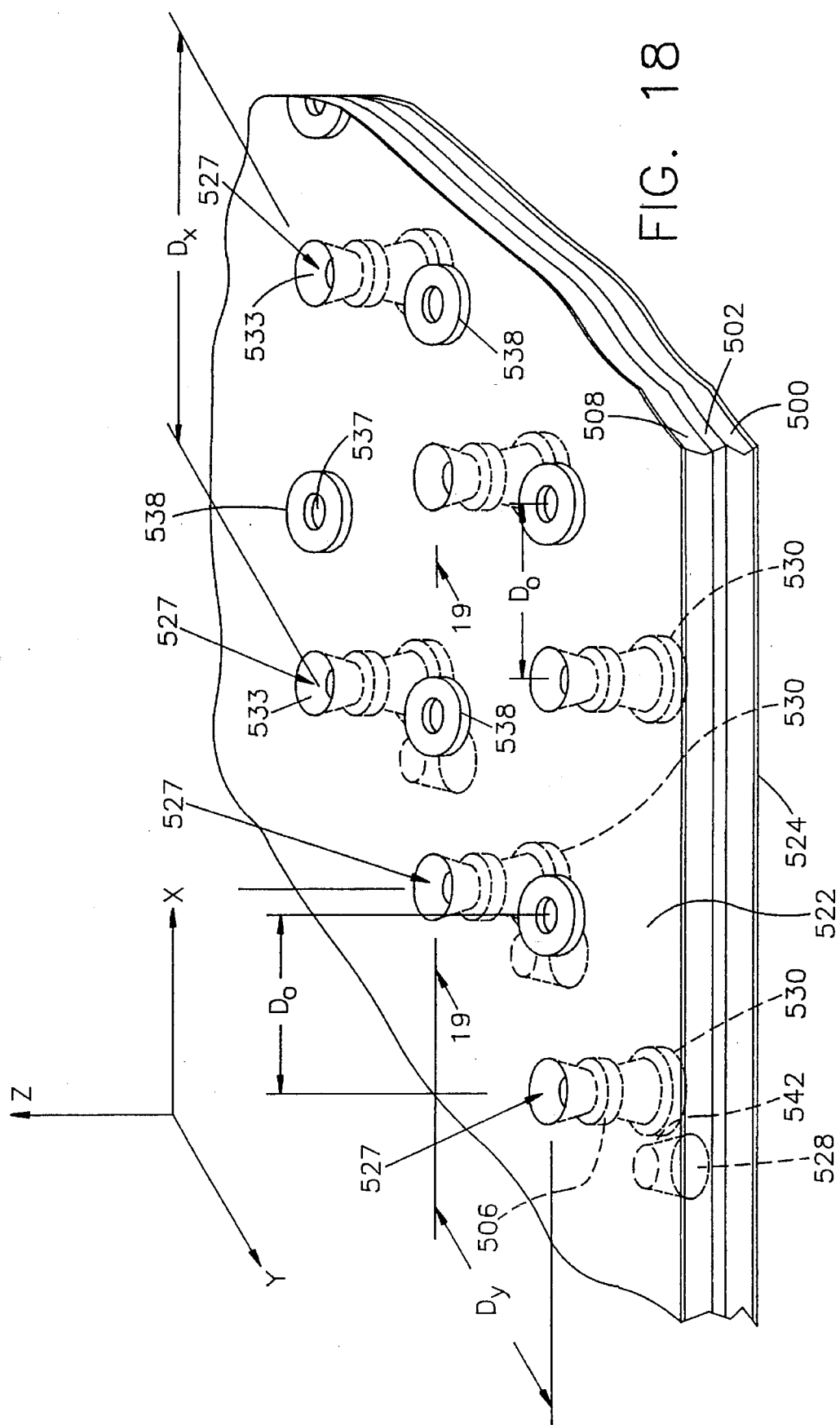

FIG. 18 is a view similar to FIG. 16 but depicting a further stage of the process.

Figure 19:
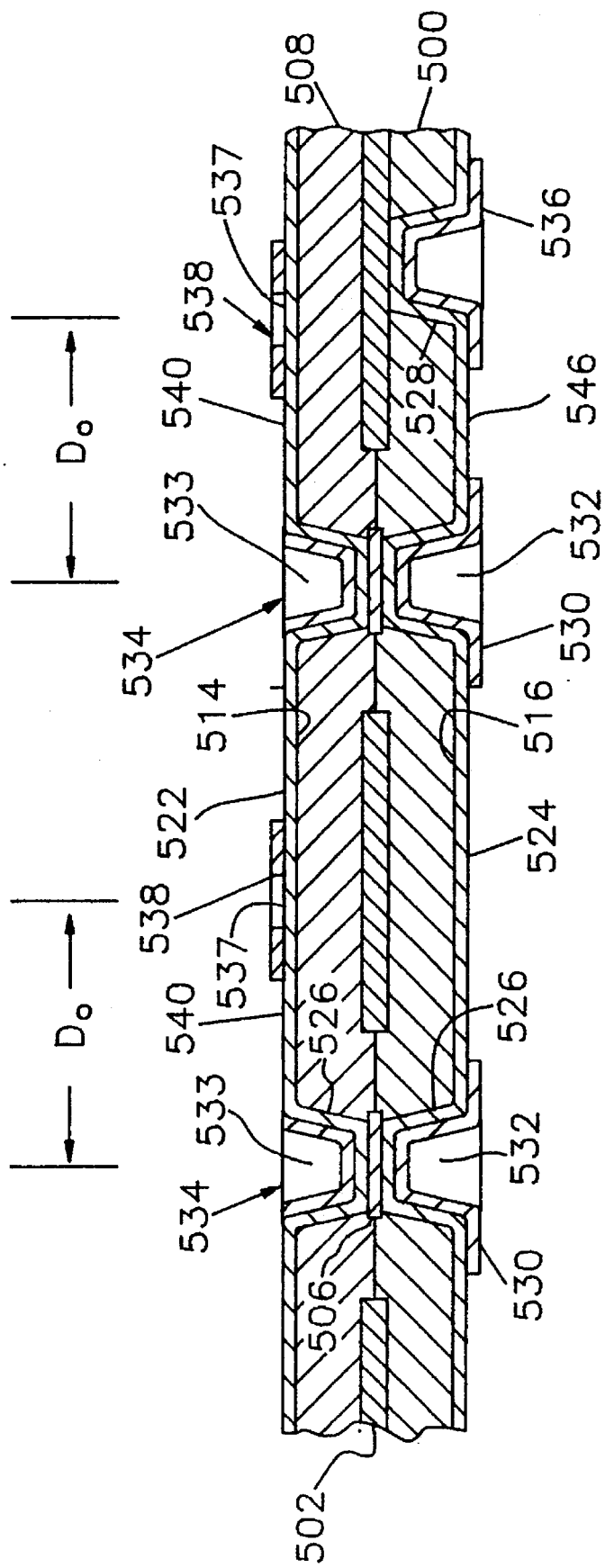

FIG. 19 is a sectional view along line 19—19 in FIG. 18.

Figure 20:
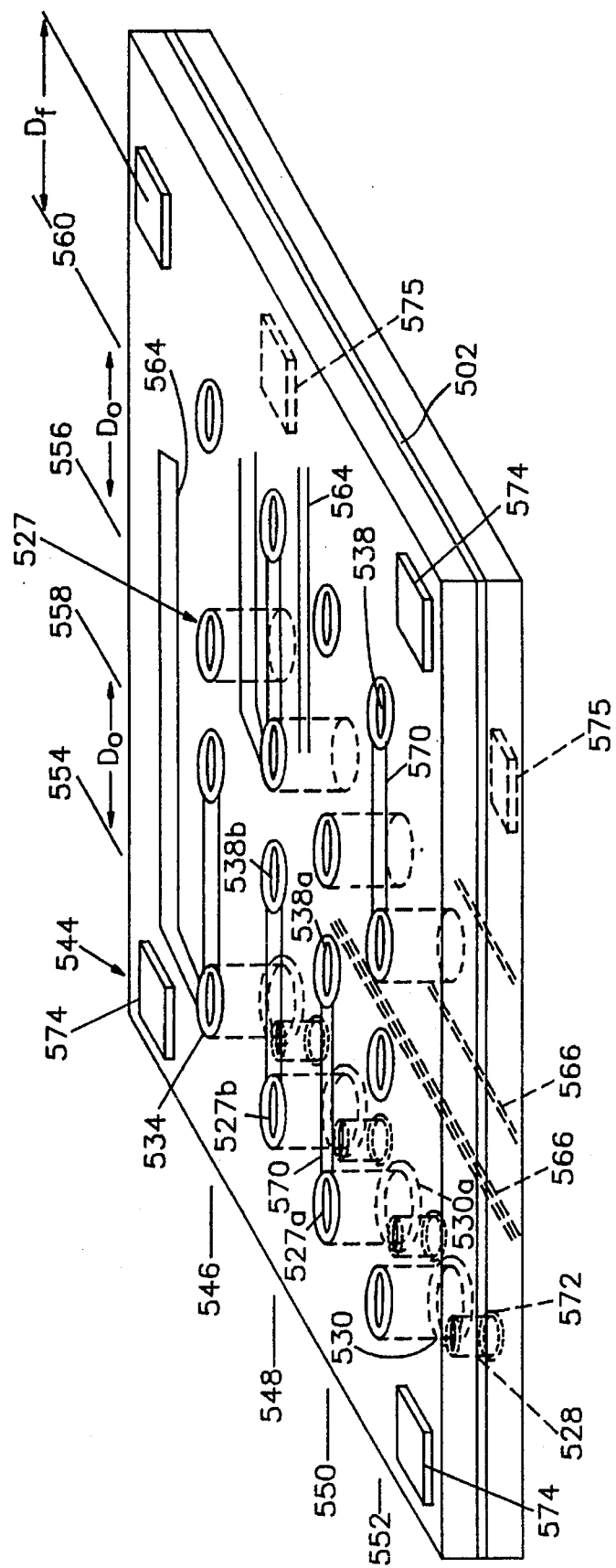
Figure 21:
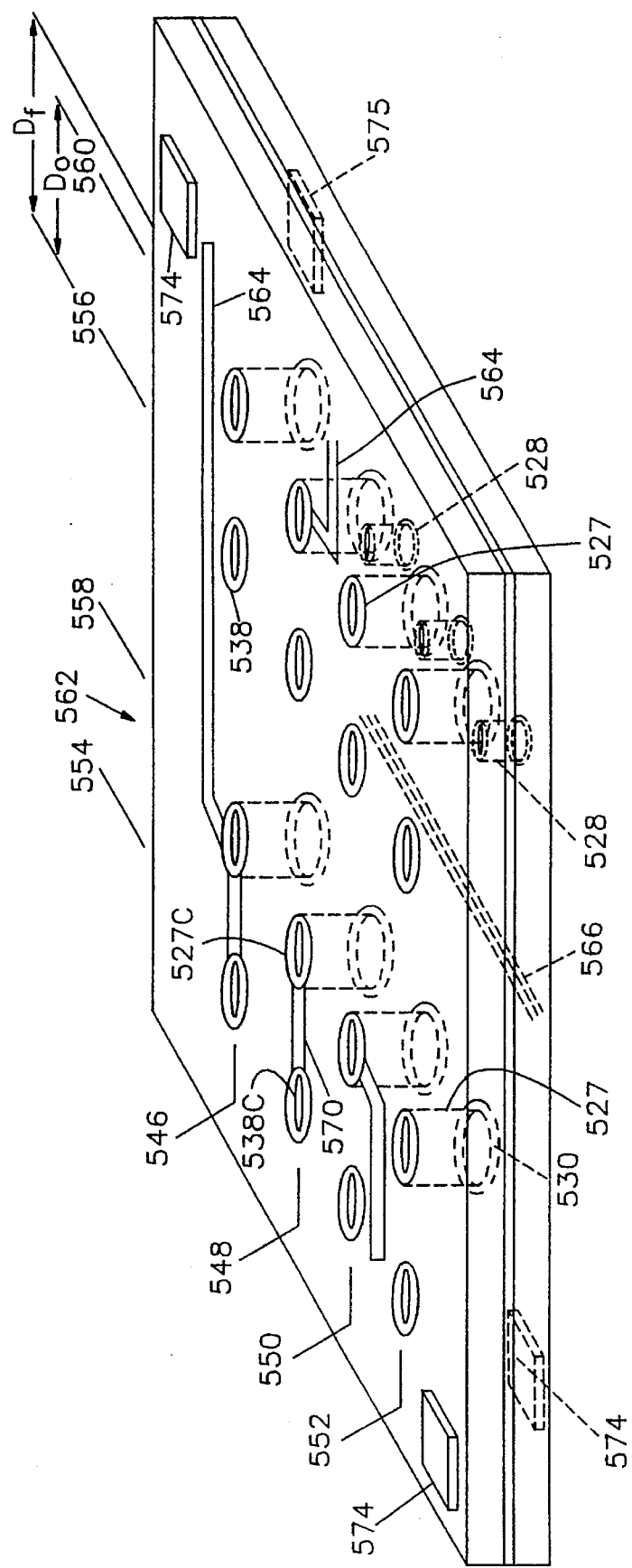
Figure 22:
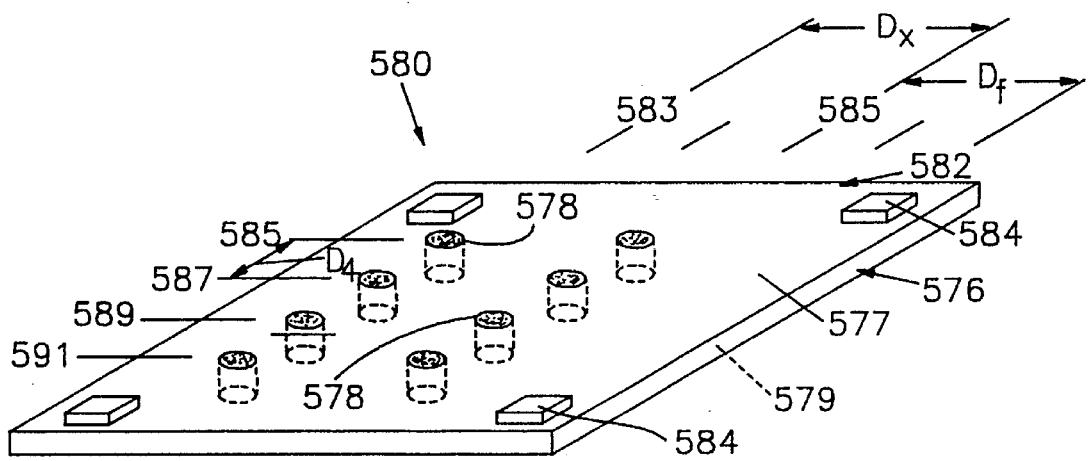

FIGS. 20 through 22 are diagrammatic perspective views of components utilized in further processes according to the present invention.

Figure 23:
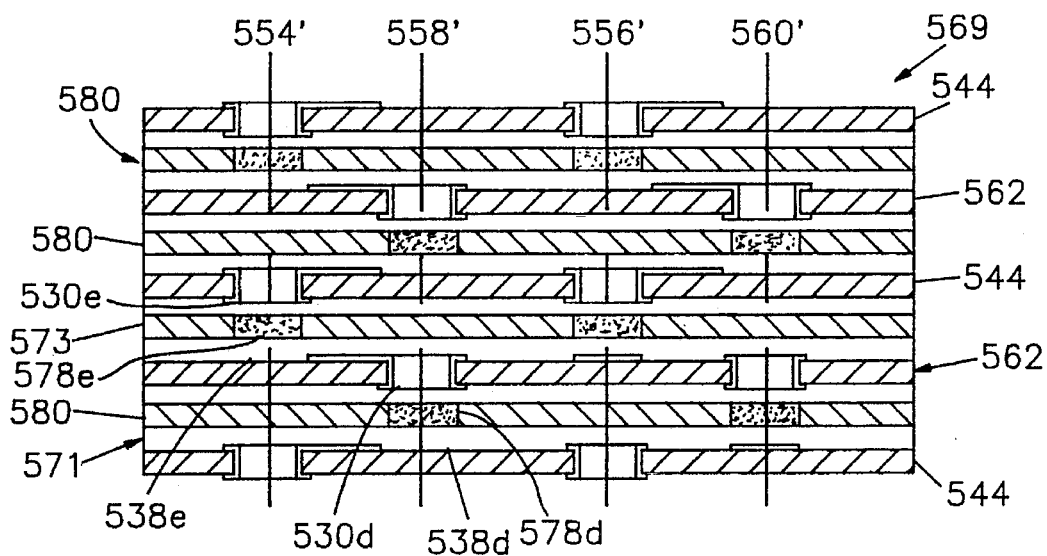

FIG. 23 is a diagrammatic elevational view of the components illustrated in FIGS. 20 through 22 assembled with one another in a later stage of the process.

Figure 24:
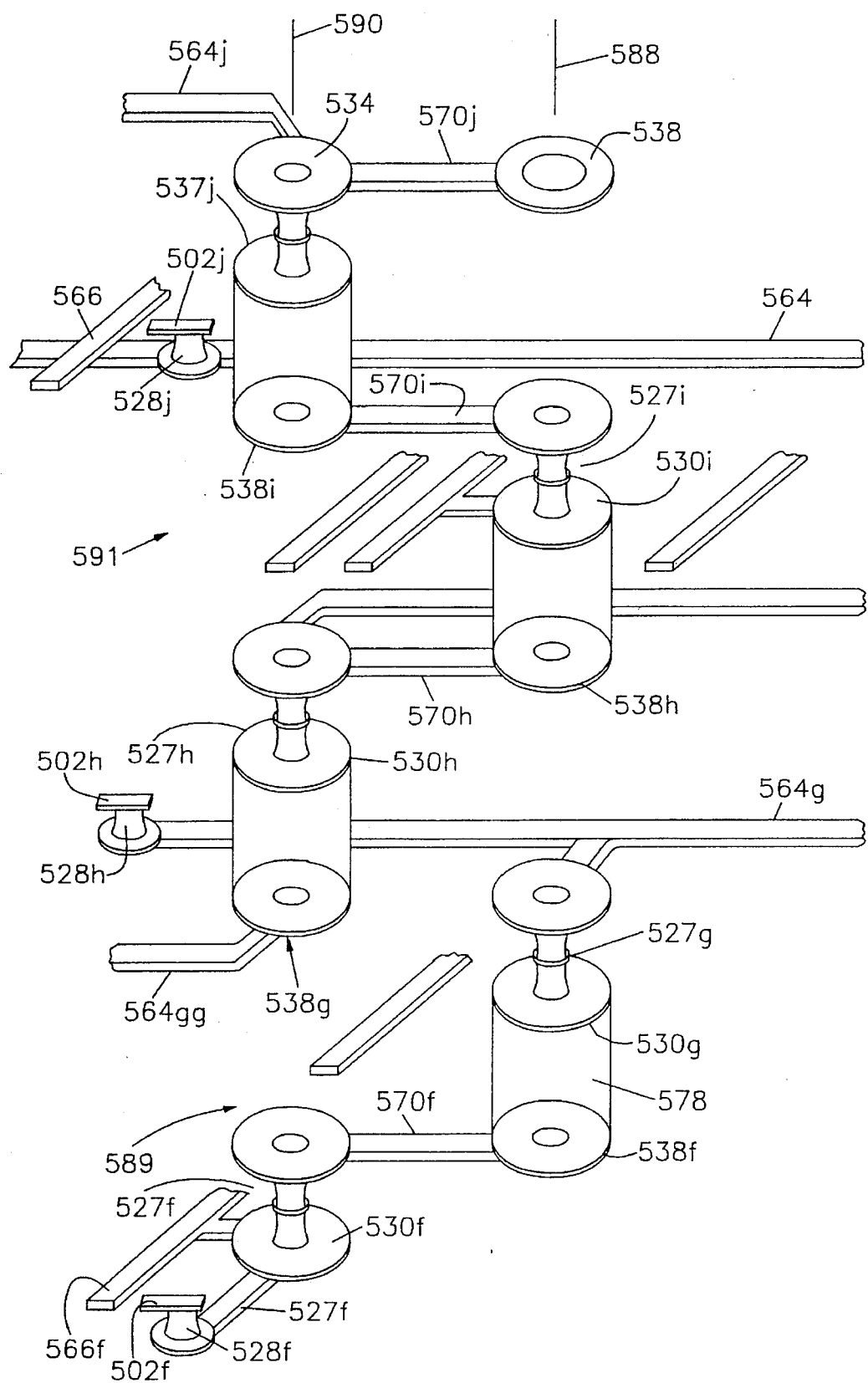

FIG. 24 is a fragmentary, diagrammatic perspective view showing portions of the assembly formed from the components of FIGS. 20–22, with parts removed for clarity of illustration.

Figure 25:
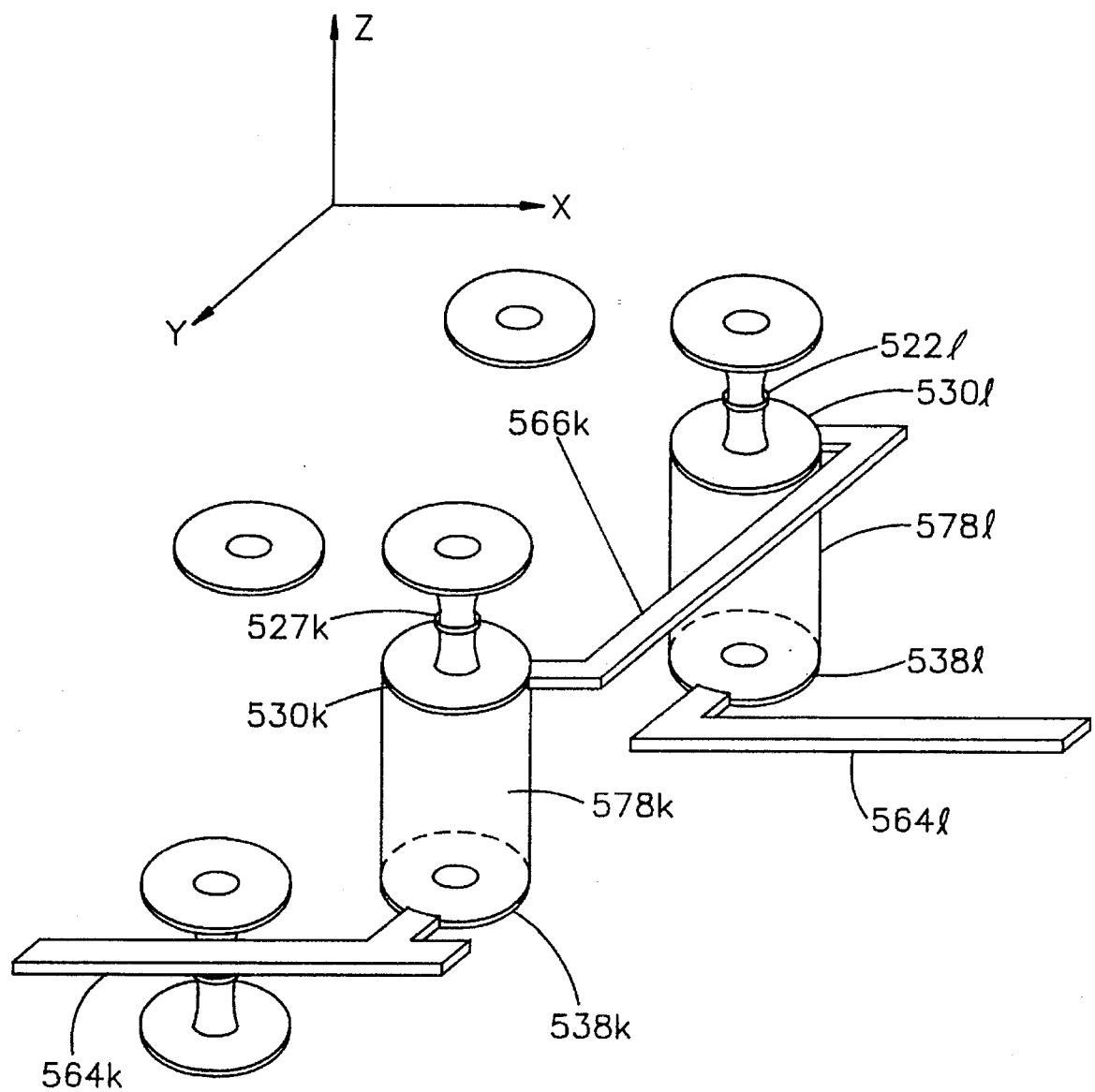
Figure 26:
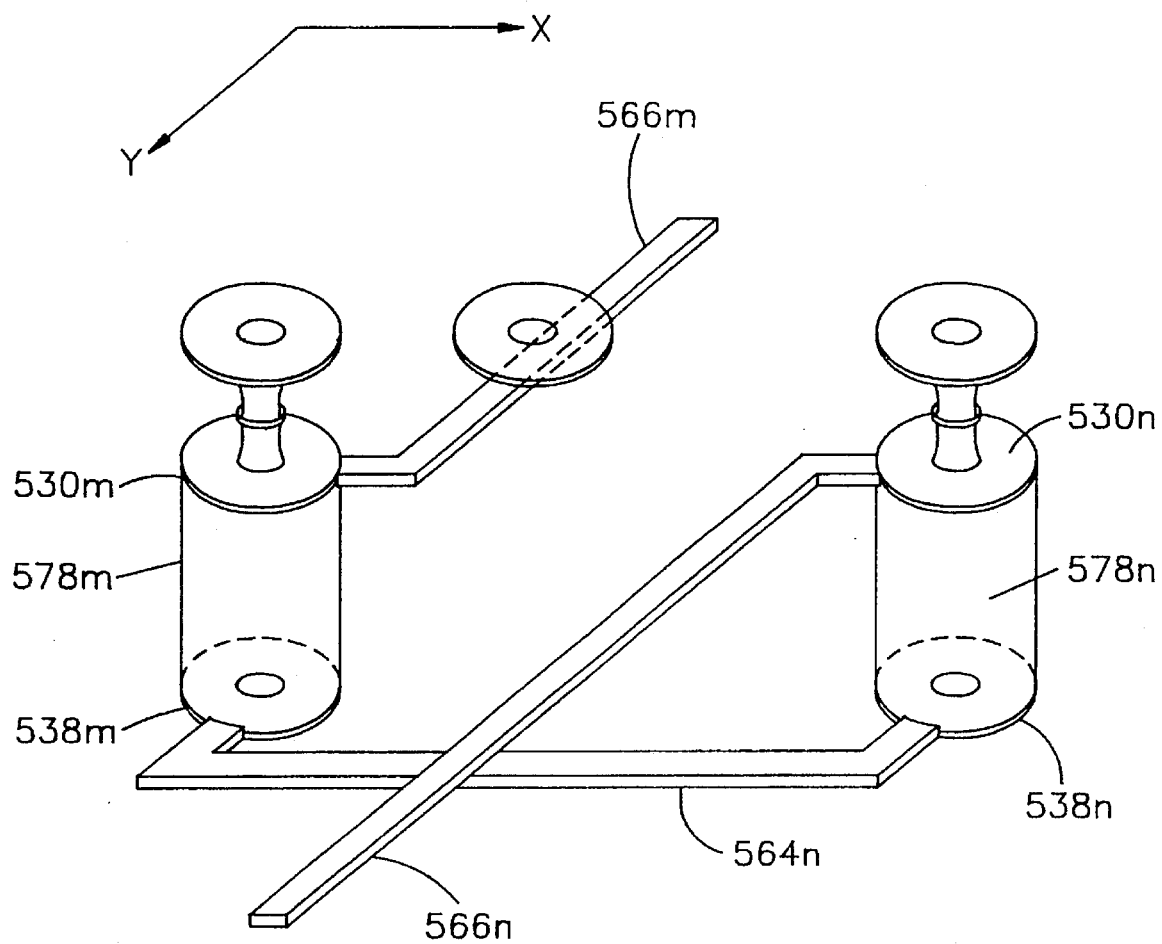

FIGS. 25 and 26 are views similar to FIG. 24 but depicting additional features of the assembly.

FIGS. 27 through 30 are fragmentary diagrammatic perspective views illustrating further embodiments of the invention.

DETAILED DESCRIPTION - LAMINATION TECHNIQUE

A method of making multi-layer circuit assemblies in accordance with one embodiment of the lamination technique invention utilizes a plurality of circuit panels 10 and interposers 12. Each circuit panel 10 incorporates a body 14 having oppositely directed major surfaces 16 and 18, the area of the major surfaces being substantially greater than the area of the edge surfaces 20 connecting these major surfaces. As used in this disclosure with reference to an object, "lamellar" means that the object is generally sheet-like or platelike. In the embodiment of FIGS. 1–3, the body 14 of each circuit panel is generally lamellar and is also substantially flat, so that the major surfaces 16 and 18 are substantially planar and parallel to one another. Each circuit panel includes electrical conductors 22 on its first or top major surface 16 and also has electrical conductors 24 on its second or bottom surface 18. As best seen in FIG. 2, conductors 22 have finite thickness, so that the exposed surface of each conductor 22, facing away from dielectric body 14 is raised above the surrounding surface 16 of the dielectric body. Thus, conductors 22 define a pattern of raised lands on surface 16, there being depressions 23 between the conductors. Likewise, conductors 24 define a pattern of raised lands on the second surface 18 of each panel 10, with depressions 25 between these raised lands.

Each circuit panel also has vias 26 extending into the panel from interconnect locations 56 and 58 on major surfaces 18 and 16 respectively. As illustrated, vias 26 extend entirely through each circuit panel. Electrically conductive material 28 is disposed within each via 26. The electrically conductive material 28 is in the form of a lining or coating on the interior wall of each via, so that the conductive material 28 within each via forms a hollow tube extending entirely through the circuit panel. Conductive material 28 in certain vias on each circuit panel electrically connects one or more conductors 22 on the first or top surface with one or more conductors 24 on the second or bottom surface of he panels.

Some or all of the circuit panels 10 may include one or more sheetlike electrically conductive potential plane elements 30 disposed within the dielectric body 14 of the circuit panel remote from both major surfaces 16 and 18 of the panel. Each potential plane element 30 may be connected to conductive linings 28 extending through the vias 26 and hence connected to one or more of the conductors 22 and 24 on the circuit panel. Apart from such deliberate interconnections the potential plane elements 30 are isolated from the other conductive elements of the circuit panel.

Circuit panels 14 may incorporate substantially conventional materials of construction normally used for making circuit panels. Thus, the dielectric bodies of circuit panels 14 may be formed from polymeric materials such as thermosetting, thermoplastic or reaction cured polymeric materials or combinations thereof including blends. Among the polymeric materials which can be used are epoxies, phenolics, elastomers, liquid crystal polymers, ketones, sultones, polyimides, epoxy modified polyimides, fluorinated polymers and combinations thereof. The dielectric bodies may incorporate reinforcing materials such as glass, ceramic, aramid or other high elastic modulus materials such as fibers, particles or hollow spheres. Fibrous reinforcements may be provided either dispersed throughout the other dielectric material of the body or as one or more sheets of knit or woven material. The dielectric bodies may also be formed from inorganic materials such as glass, ceramic, glass-ceramic materials and silicon. The electrically conductive materials used for the conductors, for the electrically conductive materials in the vias and for the potential plane elements may be metallic conductive materials such as copper or a copper alloy, aluminum, tungsten, molybdenum, nickel-iron alloys such as those known as Invar, gold, other noble metals and combinations of such metals as alloys or composites. The conductive materials may be provided as layered structures (not shown) incorporating a plating of one metal on another. Alternatively or additionally, the conductive portions of the circuit panels may include intrinsically electrically conductive polymers or mixtures of nonconductive materials such as nonconductive polymers with electrically conductive particles, such as dispersions of fine metal particles in polymers.

The arrangement of conductors 22 and 24 on each circuit panel, and the pattern of electrical connections between conductors on opposite sides of each panel are dictated by the requirements of the circuit to be provided in the finished product. Normally, the different panels used in one assembly will have differing patterns of conductors. Usually, the conductors 22 on one surface of each panel extend predominantly in one direction, whereas the conductors 24 on the opposite surface of the panel extend predominantly in a perpendicular direction. The circuit panels may also include other structures (not shown) for mounting and connecting active electrical elements.

Each interposer 12 used in the assembly process has a generally lamellar body 32 having a first major surface 34 and a second major surface 36 of substantially greater surface area than the edge surfaces of the body. The lamellar bodies may be substantially flat, sheetlike structures. Each body 32 incorporates a first layer 38 of a flowable dielectric material at its first surface 36 and a second layer 40 of flowable dielectric material at its second major surface 36. The term "flowable" as used in this disclosure means that the material is capable of undergoing fluid flow under at least some conditions. The flowable materials need not be in a fluid or liquid state at room temperature. Also, the flowable materials need not be permanently fluid, but need only remain in the fluid condition during parts of the manufacturing process as discussed below. The flowable materials used in these layers may be arranged to solidify or "set" permanently after flow during the manufacturing process. The flowable dielectric material may include one or more polymeric constituents, which may be wholly or partially organic polymers. Among the polymeric constituents which may be employed are uncured or partially cured reactive curing polymer precursors such as partially cured epoxy resins, commonly referred to as "B-stage" epoxies. Other flowable dielectric materials include unset or partially set thermosetting polymers and thermoplastic polymers. The flowable material may be an adhesive material or may incorporate an adhesive material such as a curable adhesive or a hot-melt adhesive as one component. That is, the flowable dielectric materials in layers 38 and 40 should be selected so that these materials will ultimately adhere to the dielectric material disposed on the surfaces of the circuit panels, to the conductive material on such surfaces or both. Such adhesion may occur either upon contact of the flowable dielectric material with the materials of the circuit panels during flow, or upon setting of the flowable material after such contact. Many reactive curing polymer precursors such as uncured or partially cured epoxy are inherently adhesive. Also, many thermoplastic materials will adhere to other materials, after contacting the other materials while the thermoplastics are in a softened or viscous state.

The flowable dielectric material should be substantially free of entrapped gas bubbles, and should also be substantially free of volatile materials. For purposes of the present disclosure, the term "substantially free of volatile materials" should be understood as indicating that volatile materials, if any, present in the flowable materials, will not form bubbles at the temperatures required to bring the material to a fluid condition and cure the material when such temperatures are applied under about 125 mm Hg absolute pressure. Gas bubbles or volatile materials which are not entrapped, i.e., which are present at an exposed surface of the flowable material, ordinarily need not be considered as such gas or volatiles normally will dissipate in the early portion of the laminating step without causing bubbles.

The body 32 of each interposer 12 also includes a dimensionally stable sheetlike interior element 42. Interior element 42 is disposed within body 32 remote from major surfaces 34 and 36, and extends generally parallel to these surfaces. As used with reference to a generally lamellar or sheetlike element, the term "dimensionally stable" refers to dimensional stability in the directions parallel to the major surfaces of such element. Thus, interior element 42 is resistant to deformation in the directions parallel to its major surfaces and parallel to major surfaces 34 and 36 of body 32. However, interior element 42 may be flexible such that the same can be readily bent in directions perpendicular to the major surfaces. Interior element 42 as illustrated is formed from a sheet of a relatively high elastic modulus dielectric material. Normally, the elastic modulus of the material constituting interior element 42 is higher than the elastic modulus of the flowable dielectric materials. Suitable high modulus dielectric materials for the interior element include polyimide, epoxy, crystalline polymers and liquid crystal polymers. Interior element 42 may itself incorporate reinforcing materials such as fibers or filaments either in dispersed or woven sheet form. Among the suitable fibers or filaments are glass and ceramic fibers. Interior element 42 may also be formed from substantially rigid, inflexible dielectric materials such as glass or ceramic.

Each interposer 12 has a plurality of holes extending entirely through the body. Each such hole extends from a first interconnect location 46 at the first surface 34 to a second interconnect location 47 at the second surface 36. As further set forth below, these interconnect locations on each interposer are selected to match the desired patterns of interconnect locations on the particular circuit panels 10 which would be used with such interposer. That pattern in turn is determined by the electrical design requirements of the finished circuit.

A unitary conductive element 48 formed from a flowable electrically conductive material is disposed within each hole of each interposer. Each such conductive element 48 extends entirely through the interposer from one major surface to another and hence incorporates a first portion of flowable conductive material exposed at an interconnect location 46 on the first major surface 34 of the interposer and a second portion of flowable conductive material exposed at an interconnect location 47 on the second major surface 36 of the interposer. Each such exposed conductive portion 50 may be flush with the surrounding portions of the interposer major surface or slightly recessed beneath such surface. More preferably, each exposed conductive portion protrudes slightly above the surrounding portions of the interposer major surface. The flowable dielectric material layers 38 and 40 are interrupted by the holes and by elements 48 so that the flowable conductive material is not present at interconnect locations 46 and 47 of the interposer.

The flowable conductive material utilized in elements 48 may be a metallic alloy of the type commonly used for brazing and inner lead tape automated bonding operations, such as a gold-based flowable alloy. For example, a tin-gold brazing alloy may be employed. Such an alloy may be provided with a gold-rich cover overlying the bulk alloy. Alternatively, the flowable conductive material may incorporate a non-metallic conductive material such as an intrinsically conducting flowable polymer such as a polyacetylene or an intrinsically non-conducting flowable polymer or unreacted or partially reacted polymer precursor such as an epoxy resin, together with a conductive material such as a metallic material dispersed in the non-conducting polymer or polymer precursor. As a further alternative, a solder such as lead-tin solder may be employed. However, as these solders normally require a flux or activator to achieve reasonably good bonds with the conductive elements of the circuit panels, they are less preferred. Although such fluxes and activators can be used, they can generate undesirable "outgassing" during the lamination process, and can leave undesirable residues in the finished assembly. The conducting material is "flowable" in the same sense as discussed above with respect to the dielectric material. That is, the conductive material can be made to flow under appropriate conditions, but need not be in a fluid condition at room temperature. The flowable conductive material desirably is substantially free of gas bubbles and substantially free of volatile materials as well. Also, the flowable conductive material may be arranged to set or harden to a substantially solid condition after flow. The flowable conductive material is also selected so as to form a bond with the conductive material of the circuit panel. This bond need not necessarily involve wetting of the circuit panel conductive materials by the flowable conductive material, but should be such as to provide electrical continuity therebetween.

Interposers in accordance with this embodiment may be fabricated by co-extruding, laminating or coating a sheet of dimensionally stable, high modulus material suitable for forming the interior element 42 with layers of the flowable dielectric material suitable for forming layers 38 and 40, so as to provide a semi-finished interposer sheet. This coating operation may be performed on a continuous or semi-continuous basis utilizing substantially conventional coating techniques such as calendaring, roll coating, dip coating, spray coating, electrostatic coating, electrophoretic deposition or the like. The semi-finished sheet may then be punched or drilled to form the holes at the interconnect locations. Such punching or drilling may be conducted using mechanical tools such as matched punches and dies, twist drills or the like, or else may be performed using radiant energy techniques such as application of focused laser light. Alternatively, the holes may be formed by chemical etching of dissolution processes. Desirably, each interposer is relatively thin, and hence the aspect ratio or ratio of length to diameter of the holes is relatively low, typically about 3:1 or less and ordinarily about 1:1 or less. Such holes can be readily and accurately formed. Conductive elements 48 may be formed by introducing the flowable conductive material into the holes in fluid state or by providing the flowable conductive material as preformed elements in a substantially rigid condition. For example, the conductive material for forming elements 48 may be provided in the form of a rod or wire and cut to length to form small, disk-like elements 48. Alternatively, elements 48 may be punched from a sheet of conductive material. The flowable conductive material may also be applied by deposition processes such as electrochemical or vacuum deposition, or by printing processes such as silk screen printing. It is not essential that the surfaces of elements 48 be precisely flush with the surrounding surfaces 34 and 36 of the interposer body. Likewise, it is not essential that the flowable conductive elements 48 entirely fill the holes in the interposer body.

The interposers 12 and circuit panels 10 may be assembled with one another in an assembly method according to a further embodiment of the lamination technique invention. Most desirably, the circuit panels and the interposers are inspected before assembly. Each circuit panel should be examined and, desirably, electrically tested prior to assembly with the other elements of the structure. It is a significant advantage of the lamination technique that the circuit panels can be completely formed, with conductors on both sides where necessary and with conductive connections between conductors on opposite sides before the assembly step, so that all of these elements of each circuit panel can be fully tested before the circuit panel is assembled to other elements. This greatly reduces the expense and waste associated with defects in the circuit panels, and greatly enhances the reliability of the ultimate multi panel assembly. Each circuit panel can be tested by methods conventionally used for testing double sided circuit boards. The interposers likewise can be checked by testing and/or inspection before assembly. The tests performed on the interposer desirably include tests for presence of conductive elements 48 at selected interconnect locations, absence of such conductive elements at other locations and electrical continuity of each conductive element 48, so as to assure that it extends entirely through the interposer. The ability to test the components in advance is particularly useful because the lamination steps following after the component tests are high-reliability steps. If the individual circuit panels and interposers are good, the finished assembly almost invariably will be good. This provides a significant advantage over processes which require drilling or other low-reliability operations after assembly of multiple layers.

The prechecked circuit panels and interposers are arranged in a stack as illustrated, in exploded view, in FIG. 1. Thus, the circuit panels 10 and interposers 12 are superposed on one another with their major surfaces confronting one another. The circuit panels and interposers are arranged in alternating, interleaved order so that each interposer is disposed between two circuit panels and hence one interposer is disposed between each pair of adjacent circuit panels in the stack. For example, interposer 12a is disposed between adjacent circuit panels 10a and 10b, whereas interposer 12c is disposed between panels 10b and 10c (FIG. 2). Although the panels and interposers are illustrated with spaces therebetween for clarity of illustration in FIGS. 1 and 2, the major surfaces of the circuit panels and interposers ordinarily abut one another in the stack. The stacking operation is conducted so as to align the interconnect locations on each interposer with interconnect locations on the confronting major surface of the adjacent circuit panel. Interconnect location 46a, and hence the flowable conductive material of conductive element 48a exposed at such interconnect location is aligned with interconnect location 56a of circuit panel 10a whereas interconnect location 58a of circuit panel 10b is aligned with interconnect location 47a on the opposite side of interposer 12a, and hence aligned with the conductive material of element 48a exposed at that location. There is exposed electric conductive material on each circuit panel at each such interconnect location. In the arrangement illustrated the exposed electrically conductive material at each interconnect location on each circuit panel includes the electrically conductive element 28 within a via. For example, via 26a extends inwardly from the lower major surface 18a of circuit panel 10a, and hence the exposed conductive material at interconnect location 56a on surface 18a includes the conductive material of conductive element 28a within via 26a. As will be appreciated, the conductive elements 28 extending through each of the circuit panels may constitute exposed conductive material at two separate interconnect locations on two opposite sides of the circuit panel.

The desired alignment can be achieved manually or by automatic vision and/or robotic placement systems capable of directly observing the patterns of conductive material on the various elements and aligning the elements accordingly. Alternatively or additionally, the circuit panels and interposers can be provided with features such as guide holes or edges disposed at preselected locations relative to the interconnect locations and these guide holes can be engaged with guide pins or rods.

While the conductive materials of bodies 48 and the dielectric materials of layers 38 and 40 are in a fluid condition, and while the circuit panels and interposers are maintained in alignment, the circuit panels and interposers are forced together, as by squeezing the stacked circuit panels and interposers between a pair of opposed platens 66 (FIG. 3). If necessary to bring the flowable conductive materials of bodies 48 or the flowable dielectric materials of layers 38 and 40 to a fluid state, the interposers and desirably, also the circuit panels may be heated to an elevated temperature either before or during the pressing operation. Thus, the circuit panels and interposers may be a preheated individually prior to stacking, or the entire stack may be heated by applying heat to the platens during the squeezing operation, or both. As the circuit panels and interposers are forced together, the flowable conductive material at the interconnect locations on each surface of each interposer contacts conductive material of the confronting circuit panel at the aligned interconnect location of that circuit panel. For example, the flowable conductive material of body 48a at interconnect location 46a on interposer 12a contacts the conductive, tubular element 28 at the aligned interconnect location 56a of circuit panel 10a. Likewise, flowable conductive material at interconnect location 47a flows into contact with the electrically conductive material at the aligned interconnect location 58a of circuit panel 10b. The electrically conductive materials join with the conductive materials of the circuit panels to form a continuous electrically conductive path. Preferably, the flowable conductive material bonds to the other conductive material. Because the flowable conductive material at each interconnect location on one surface of each interposer is already electrically connected to flowable conductive material on the opposite surface of the same interposer, this forms a continuous conductive path extending between the interconnect locations of adjacent circuit panels. For example, the flowable conductive material of body 48a, including conductive material at locations 46a and 47a on opposite sides of the interposer joins with the conductive material of circuit panels 10a and 10b at interconnect locations 56a and 58a of each such circuit panel to form a continuous electrical conductor extending between the conductive materials of the two circuit panels. This serves to interconnect the conductors 22 and 24 on each circuit panel with conductors on other circuit panels.

The flowable dielectric materials 38 and 40 on the surfaces of the interposers flow into intimate contact with the confronting surfaces of the adjacent circuit panels, and fill depressions between conductors on those surfaces. For example, the flowable dielectric material of layer 38a on interposer 12a flows to fill the spaces 25 between conductors 24 on surface 18a of circuit panel 10a. The flowable dielectric material most preferably bonds to the dielectric bodies of the circuit panels and desirably also to the surface conductors on the circuit panels. Thus, after such flow, each conductor is entirely surrounded by the dielectric material of the panel bodies 14 and by the flowable dielectric materials. This encapsulation of the conductors on the circuit panels is achieved even though the circuit panels do not include a flowable dielectric material at their major surfaces.

After the flowable conductive materials and flowable dielectric materials have been allowed to flow in this fashion, the flowable materials are set or brought to a substantially solid condition. Flowable materials such as metallic solders and thermoplastic materials preferably are set simply by allowing the stack to cool. Reactive materials such as epoxies and other polymer precursors may be set by allowing the reaction to proceed. The completed assembly is then ready for use. Electrical components such as semiconductor chips or discrete devices can be mounted to exposed surfaces of the top and/or bottom circuit panels 10a and 10c and the electrically connected to the conductors 22 and 24 on those panels. The panel assembly may also be coated, on the exposed surfaces of the top and bottom panels, with a flowable dielectric material to protect the exposed conductors on those surfaces. Because the conductors on the interior circuit panel surfaces, abutting an interposer 12 are fully encapsulated within the dielectric material of the interposer and the confronting dielectric material 14 of the circuit panel bodies, these conductors are inherently protected from corrosion or other deteriorating effects of the atmosphere. Likewise, because these interior conductors are fully surrounded by solid dielectric material of known and predictable electrical properties, the unpredictable electrical effects caused by air voids in the immediate vicinity of a conductor are eliminated.

Several features of the process combine to provide extremely high reliability. Some of the flowable conductive material at each set of aligned, confronting interconnect locations penetrates into the spaces 26 defined in the vias of the circuit panels. The spaces of the vias thus act as reservoirs to take up any excess flowable conductive material which may be present at that particular set of interconnect locations. This serves to absorb variations in distances between adjacent circuit panels at the various interconnect locations. If the surfaces of circuit panels or interposers are not precisely planar, or are not parallel with one another, some portions of a particular circuit panel may engage the conductive material of the interposer before others during the assembly process. However, because the conductive material of the interposer is flowable, and because it can flow into the spaces within the reservoirs at the interconnect locations, the conductive material of the interposer at these first-contacted locations will yield and allow the panel to move towards the interposer, thus allowing the conductive material of the interposer to contact the conductive material at other interconnect locations on the same panel. Also, because the conductive material of the interposer can flow into the reservoirs defined in the circuit panels, the flowable conductive material can make reliable contact over the substantial area of conductive material defined by the interior conductive lining 28 of each reservoir.

The flowable dielectric materials of the interposers can achieve reliable, full surface contacts with the surfaces of the circuit panels even where the circuit panels surfaces are irregular or deviate substantially from exact planarity and parallelism. Flow of the dielectric materials compensates for any such deviation. Some of the flowable dielectric material may be forced into space previously occupied by flowable conductive material and/or into some or all of the reservoirs defined on the circuit panels. As best seen in FIG. 3, some of the flowable dielectric material of layers 38 and 40 on interposer 12a has bulged into space originally occupied by flowable conductive material 48a. Also, where a via space or reservoir 56 of a circuit panel confronts a portion of an interposer which is not provided with conductive material, some of the flowable dielectric material can penetrate into that via space. For example, some of the flowable dielectric materials of layer 38 on interposer 12b adjacent the bottom of the stack in FIG. 3 is shown as penetrating into the space 26b in circuit panel 10b.

The process is also relatively insensitive to deviations from perfect alignment between the interconnect locations on the various elements. As illustrated in FIG. 4, the interconnect locations on interposer 12 may be misaligned relative to the adjacent circuit panels in directions parallel to the major surfaces of the interposer and panels. Provided that such misalignment amounts to less than the full diameter of one reservoir or via hole 26, the flowable conductive material 48 of the adjacent interposer will still make contact with the conductive material 28 at the interconnect locations of the adjacent circuit panels. Because the dielectric material 38 and 40 on the surfaces of each interposer 12 is flowable, the dielectric material will not hold the circuit panel away from the conductive material of the interposer. Rather, both the dielectric material and the conductive material will penetrate into reservoirs or spaces 26. Likewise, as illustrated in FIG. 5, the circuit panels on opposite sides of a particular interposer can be misaligned with that interposer and within one another to a considerable degree but will still be reliably interconnected by the conductive material of the interposer. Here again, the dielectric material of the interposer does not interfere with the connection. Any excess dielectric material, along with any excess conductive material is simply forced into the reservoirs or spaces 26.

The ability to tolerate such misalignment is particularly important with circuit panels having very small dimensions. As the dimensions, such as the diameter and distance between adjacent vias of the circuit panels diminish, the tolerances encountered in fabrication and alignment of the circuit panels and interposers amount to progressively larger percentages of the dimensions themselves. Nonetheless, because the degree of misalignment which can be tolerated is equal to the full diameter of a via 26, substantial misalignments can be tolerated even with very small via diameters and very close spacing between adjacent vias. This aspect of the lamination technique invention is particularly important in fabrication of small, densely packed circuit assemblies of the type used with semiconductor chips. Particularly preferred circuit panel assemblies incorporate circuit panels with the vias less than about 0.5 mm in diameter, and more preferably less than about 0.25 mm in diameter, spaced at intervals of about 1.0 mm or less and more preferably 0.5 mm or less.

As illustrated in FIGS. 6 and 7, an interposer 12' in accordance with an alternate embodiment of the lamination technique invention includes an interior element 42' having apertures or perforations 43 extending inwardly from its major surfaces. Layer 38' and 40' of flowable dielectric material extend over opposite major surfaces of interior element 42' and hence define the major surfaces 34' and 36' of the interposer, except at the interconnect locations where flowable conductive material 48' is exposed at the major surfaces of the interposer.

Interior element 42' may be made from the same materials as discussed above with reference to the interior element of the interposers. Apertures 43 preferably are separated from one another by webs of the interior element material, so that the interior element retains substantial strength and dimensional stability despite the presence of the apertures. Flowable conductive material layers 38' and 40' may be applied on the surfaces of interior element 42' by any convenient process. However, the application process should not be such as to completely fill apertures 43 with the flowable dielectric material during manufacture of the interposer. Thus, prior to the assembly process, apertures 43 should have appreciable space within them unoccupied by the flowable dielectric material.

As best seen in FIG. 7, an interposer 12' is utilized in a process, substantially the same as that discussed above. As discussed above, when the flowable conductive materials 48' and the flowable dielectric materials 38' and 40' are in a fluid condition, the stacked circuit panels and interposers are squeezed between opposed platens so as force adjacent circuit panels 10' towards one another and thus compress interposer 12' therebetween. Here again, some of the flowable conductive material 48' on the interposer flows into a reservoir space 26' at each interconnect location. Here also, the dielectric material on each major surface of each interposer flows into intimate contact with the confronting surfaces of the circuit panels 10', and fills spaces between conductors on the surfaces of the circuit panels. The unfilled apertures 43 in the interior elements 42' serve as additional reservoirs for accepting flowable dielectric material. Thus, some of the flowable dielectric material of layers 38' and 40' is forced into these apertures as the circuit panels 10' are forced towards one another. This permits substantial compression of the interposers to occur during the laminating process, and markedly increases the ability of the system to provide reliable performance even where the circuit panel surfaces 16' and 18' deviate substantially from exact planarity. Moreover, the apertures provide additional compensation for uneven conductor densities on different portions of the circuit panel surfaces. Flow of the dielectric material 38' and 40' into apertures 43' compensates for the volume occupied by conductors 22 and 24 on the surfaces of the circuit panels. The flowable dielectric material displaced by these conductors can flow into the unfilled apertures and need not flow laterally, parallel to the circuit panel surfaces.

An interposer 12" in accordance with yet another embodiment of the lamination technique invention is illustrated in FIG. 8. This interposer incorporates an interior element 42" formed from a fibrous material 42" including fibers 70. The fibers 70 cooperatively define interior spaces 72, which function in the manner as the discrete apertures 43 of the embodiment discussed above with reference to FIGS. 6 and 7. Masses of flowable conductive material 48" extend through holes in flowable dielectric layers 38' and 40", and in fibrous interior element 42". In a variant of this approach, (not shown) holes may be formed in the flowable dielectric layers 38" and 40", as by laser-ablating these layers selectively after they are assembled with interior element 42". The masses of flowable conductive material may be provided as separate masses positioned in these holes, so that the separate masses are disposed on opposite sides of the interior element. During the lamination process, the flowable conductive material may penetrate through the interior element from opposite sides thereof, so that the flowable conductive material forms unitary masses extending entirely through the interposer. In a further variant, the flowable conductive material may be allowed to flow through the interior element and thus form the unitary mass before the laminating process. In yet another variant, the masses of flowable conductive material may be deposited on the interior element, and the flowable dielectric material layers may be selectively deposited on the regions surrounding the conductive material. In arrangements such as that shown in FIG. 8 and in the above-described variants, the unfilled spaces within the interior element may serve as a reservoir to take up the flowable conductive material during the lamination process.

Interior elements incorporating unfilled spaces, such as the discrete apertures 43 of FIG. 6 and 7 or the inter-fiber apertures 72 of FIG. 8 should be arranged to permit flow of the flowable dielectric material into the apertures when the dielectric material is in its fluid state, but to provide appreciable resistance to such flow. This will assure that, when the stacked interposers and circuit panels are forced together, the flowable dielectric material reaches appreciable pressure and hence penetrates into the spaces between conductors and other irregularities on the circuit panel surfaces before the flowable dielectric completely fills the apertures in the interior element. Stated another way, the resistance to flow of the dielectric material into the apertures should be at least about equal to the resistance to flow of the dielectric material into the spaces between conductors on the circuit panel surfaces. Thus, dimensions of the aperture openings at the boundary between the flowable dielectric material layers and the interior elements desirably are not greater than the distances between adjacent conductors on the surfaces of the circuit panels. Smaller aperture openings provide still greater resistance to flow into the spaces within the interior element.

The interposer 112 illustrated in FIG. 9 has no interior element but instead has a solid body of flowable dielectric material providing flowable dielectric material at both major surfaces 134 and 136. In lamination processes which use interposers having no interior elements, the temperature and pressure conditions should be closely controlled so that the flowable dielectric material of body 138 at surfaces 134 and 136 becomes fluid enough to penetrate into spaces between conductors on the circuit panels, but so that gross flow of the dielectric material does not sweep the conductive elements of the interposer out of position. Thus, the flowable conductive materials should be brought to a paste-like or viscous state.

The interposer illustrated in FIG. 9 also has conductive elements incorporating a composite flowable conductive material 148 formed from a dispersion of electrically conductive particles 149 in an electrically non-conductive polymeric matrix 151. Although this composite material is electrically conductive, its conductivity is lower than that of a pure metal and therefore the electrical resistance through the entire body 148 is relatively high. To provide low resistance conductive pathways between adjacent circuit panels, a strip-like metallic conductor 153 extends substantially the entire thickness of interposer 112, from adjacent the upper or first surface 134 to adjacent the lower or second surface 136, this conductor being in contact with the composite flowable conductive material 148. When this flowable conductive material makes contact with the conductive material of circuit panels on opposite sides of the interposer, the conductive materials of the circuit panels will be disposed in proximity to metallic conductors 153. At each interconnect location, the conductive material of the circuit panel will be connected to the metallic conductor 153 of the interposer by only a short, low-resistance path through the composite flowable conductive material.

The interposer illustrated in FIG. 10 differs from those discussed above in that the flowable conductive elements are not unitary bodies of flowable conductive material extending entirely through the interposer. Rather, each conductive element includes a discrete mass 248 of flowable electrically conductive material on one major surface of the interposer, a separate mass of flowable electrically conductive material 249 at the opposite major surface and a non-flowable electrical conductor 250 extending through the interposer, between these two masses 248 and 149. Also, in the interposer of FIG. 10, some of the interconnect locations on opposite surfaces of the interposer are offset from the electrically connected interconnect locations on the opposite side. For example, the interconnect location defined by mass 248a on major surface 234 is offset from the electrically connected mass and interconnect location 249a on surface 236. This arrangement can be used where the interconnect locations on adjacent circuit panel surfaces are offset from one another.

As illustrated in FIG. 11, an assembly using an interposer 312 having a mass of flowable conductive material 348 extending entirely through the interposer need not have reservoirs in all of the circuit panels. Thus, circuit panel 310b does not have a via hole or reservoir at interconnect location 358a. Rather, that interconnect location has only a flat plate or disk of conductive material connected to a electrical conductor 322 on the surface of the circuit panel. However, interconnect location 356a on the surface 318 of panel 310a has a reservoir 326 open to surface 318 as well as conductive material in the form or a via liner 328 at the interconnect location. Reservoir 326 accepts excess conductive materials from the body or mass 348 of conductive material in interposer 312 during the assembly process. Because body 348 of flowable conductive material is entirely in a fluid state during the assembly process, reservoir 326 is effectively in fluid communication with interconnect location 358a, on the opposite side of interposer 312 as well as with interconnect location 356a. Any excess flowable conductive material which may be present at interconnect location 358 can pass upwardly, towards interconnect location 356, so that reservoir 326 effectively takes up excess conductive material for both interconnect locations.

The interior element 342 of interposer 312 is metallic, so that the same can be used as a ground plane or other potential plane in the finished circuit assembly. Interior element 342 thus is arranged to contact some, but not all, of the masses 348 of flowable conductive material so as to provide electrical connections to the potential plane. In the finished circuit, interior element 342 is electrically connected through the circuit panel conductors which are electrically connected to the flowable conductive masses. The remaining flowable conductive masses (not shown) are electrically isolated from the conductive interior element 342 by dielectric material surrounding such flowable conductive masses.

In the arrangement shown in FIG. 12, the circuit panels 410 do not have reservoirs at their respective interconnect locations 456 and 458. The interposer 480 has masses of flowable conductive material 448 extending entirely through the interposer between interconnect locations 446 and 447 on opposite sides of the interposer. The interior element 442 of the interposer defines reservoirs 451 open to each such mass 448, as well as apertures 443 open to the flowable dielectric material layers 438 and 440. During the laminating process, excess flowable conductive material from masses 448 may be forced into reservoirs 451 as the circuit panels 410 brought together, in much the same way as excess flowable dielectric material from layers 438 and 440 is forced into apertures 443. Thus, each reservoir 451 is in fluid communication with aligned, confronting interconnect locations 446 and 456, and with the aligned, confronting interconnect locations 458 and 447, so that reservoir 451 can take up excess flowable conductive material from each such pair of aligned, confronting interconnect locations.

As will be readily appreciated, numerous further variations and combinations of the features discussed above can be utilized. Merely by way of example, the overall scheme illustrated in FIGS. 1–5 can be reversed so as to provide the circuit panels with masses of flowable conductive material and to provide reservoirs in the form of conductive, tubular elements extending through the interposers. Also, the number of circuit panels and interposers used in assemblies according to the invention can be as many or as few as desired, although normally at least two circuit panels and at least one interposer would be utilized. The lamellar components can be curved as well as flat. The circuit panels disposed at the extremities of the stack need not be lamellar. The surfaces of such an extreme circuit panel which do not confront an interposer may have any desired configuration. For example, the topmost or bottommost circuit panel may be formed as part of a housing or other component having projections, walls or the like on the side facing away from the stack, or on the stack-facing side outside of the region which overlies the stack. Likewise, regions of the interior circuit panels and/or of the interposers which project laterally out of the stack and do not confront another element in the stack, may be non-lamellar. The alignment and lamination processes discussed above can be modified to operate on a continuous or semi-continuous basis. Thus, the circuit panels and interposers can be provided in the form of continuous ribbons or tapes, and the lamination process can be performed using continuous lamination equipment such as nip rollers or the like. Conversely, it is not essential that all of the components of an individual interposer be secured together prior to stacking with the circuit panels. For example, each interposer could be formed by layers of flowable materials and an interior layer as discussed above which are stacked in position concomitantly with stacking of the circuit panels. In yet another modification, the lamination procedures can be performed stepwise, as by stacking two or more circuit panels with appropriate interposers and forming the same into a subassembly as discussed above, and then stacking that subassembly with one or more additional circuit panels and interposers, or with a further subassembly and an interposer, and laminating this larger stack to form a larger assembly.

DETAILED DESCRIPTION - PREFERRED EMBODIMENTS OF THE PRESENT INVENTION

A method of making a circuit panel precursor in accordance with one embodiment of the present invention utilizes a first sheet 500 (FIG. 13) of a dielectric material. The dielectric material may be selected from the group of materials useful in circuit panels of the lamination technique invention as discussed above. Preferably however, the first sheet is formed from a thermoplastic polymer, and most preferably from polyimide. Sheet 500 desirably is less than about 250 micrometers thick and more preferably less than about 150 micrometers thick. A substantially continuous layer of an electrically conductive material such as a copper, copper-alloy, or other metal is laminated on one surface of sheet 500. The conductive, metallic layer may be applied by conventional plating or other deposition processes or else may be provided as a separate self-supporting layer and laminated with sheet 500 by juxtaposing the two layers under heat and pressure, as in a nip-type or platen-type laminating press. Portions of layer 502 are then removed to form the configuration illustrated in (FIG. 14). After this removal step, layer 502 includes apertures 504 and islands 506 disposed in a regular, rectilinear grid pattern. The rectilinear pattern of islands 506 includes columns extending in a first direction parallel to the plane of the layers, indicated by arrow x in FIG. 14, and rows extending in a second, orthogonal direction also parallel to the plane of the layers, as indicated by arrow y.

One island 506 is disposed within each aperture 504. Each island is separated from the remaining portions of sheet 502. Thus, in forming the islands 506 and apertures 504, annular portions of sheet 502 surrounding each island 506 are removed. This selective removal can be performed by any of the selective metal removal processes commonly used in fabrication of electronic components. For example, layer 502 may be coated with a photoresist and the photoresist may be selectively exposed to light so as to cure the photoresist except in annular areas corresponding to the annular portions to be removed. The photoresist may then be washed so as to remove the uncured photo resist, leaving the annular areas exposed, and the layer may then be etched by exposure to an etching solution. The photoresist protects the layer so that only the exposed annular areas are removed. Alternatively, layer 502 may be formed with holes 504 and islands 506 via a process of selective deposition on dielectric layer or sheet 500. Any known selective deposition process capable of depositing the material employed for layer 502 may be utilized. Merely by way of example, the surface of sheet 500 may be selectively coated with a resist in the annular areas corresponding to holes 504 and then exposed to an electroless plating solution so as to deposit the metallic material in those areas not covered by the resist.

After conductive layer 502 has been formed and provided with the apertures and islands, additional dielectric material is applied atop the conductive layer 502 so as to provide a second dielectric layer 508 (FIG. 15) and thereby form a laminate including the conductive material of layer 502 between the dielectric layers 500 and 508. The surface 516 of the lower dielectric layer 500 remote from conductive layer 502 defines the bottom surface of the laminate, whereas the surface 514 of the upper dielectric layer 508 forms the top surface of the laminate. The dielectric material of layer 508 preferably has the same composition and thickness as the dielectric material of layer 500, although different dielectric materials and different thicknesses can also be employed. The material of layer 508 may be applied either by coating the dielectric in liquid form, or, preferably, by applying layer 508 as a separate, coherent sheet and uniting such separate sheet with layers 500 and 502 under heat and pressure, as in a nip-type or platen-type laminating press. Dielectric layers 500 and 508 should penetrate through the open, annular, regions of apertures 504 and merge with one another within these open, annular regions so as to provide dielectric material 510 within each aperture 504 between each island 506 and the surrounding regions of conductive layer 502. Although only two apertures 504 and two islands 506 are illustrated in FIG. 15, the remaining holes and islands have a substantially similar construction.

In the next stage of the process, via holes 512 (FIGS. 16 and 17) are formed in each dielectric sheet 500 and 508 in alignment with islands 506 so that each island 506 is exposed to the top surface 514 of the laminate and is also exposed to the bottom surface 516 of the laminate. The via holes 512 are disposed in columns extending in the first or x direction and rows extending in the second or y direction. Via holes 512 may be formed by selectively exposing regions of surfaces 514 and 516 aligned with the islands 506 to radiant energy such as light from a laser or other suitable high-intensity source for a brief time so as to erode or ablate the dielectric material and thereby form the holes 512. Other processes of selective removal can also be employed. For example, polymers can be selectively etched by chemical etching solutions using a suitable photoresist for masking. As best appreciated with reference to FIG. 16, each via hole hole 512 extends through slightly less than half the entire thickness of the laminate. Thus, although via holes 512 tend to taper or decrease in diameter with increasing distance from surfaces 514 and 516, this taper does not materially reduce the diameter of each via hole 512 over the limited distance from the surfaces to the conductive islands. In the same fashion, riser holes 520 are formed only in the first or lower dielectric sheet 500. These riser holes extend from the bottom surface 516 of the laminate to sheet 502 at locations outside of apertures 504, so that the continuous region of sheet 502 is exposed through each riser hole 520. Riser holes 520 are interspersed within rows via holes 512, as also seen in section in FIG. 17. Each of these riser holes is aligned with the via holes of the row in the first or x direction but offset from the adjacent via hole in the second or y direction by a riser offset distance $D_r$. The other row of via holes 512 shown in FIG. 16 is devoid of riser holes. Preferably, the riser holes 520 are provided in a regular pattern having a preselected relationship to the pattern of the islands 506 and via holes 512. For example, riser holes 520 may be provided in every fourth row of islands and via holes 512. Alternatively, riser holes may be provided in every row of via holes.

In order to form via holes 512 in registration with the islands 506, it is desirable to determine the locations of the islands by optical measurement, as by a robot vision system. Where one or both of the dielectric layers 500 and 508 is transparent, the islands can be observed directly such a robot vision system. Alternatively, if both of layers 500 and 508 are opaque, one or more fiducial marks 518 (FIG. 14) can be formed in layer 502 in predetermined spatial relationship to the islands by the same process as is used to form the apertures 504 and the islands 506. For example, these may be formed in the photo etching process discussed above. Those regions of sheet 502 incorporating the fiducial marks may be left uncovered by sheet 508, so that the fiducial marks can be observed by the robot vision system.

After holes 512 and 520 have been formed, further layers 522 and 524 (FIGS. 18 and 19) of a base, etchable electrically conductive material such as copper or another base metal are deposited on the top and bottom surfaces 514 and 516 of the laminate respectively. These layers cover the entire top and bottom surfaces. The base metal of the top and bottom layers extends into the via holes 512 and forms hollow, tubular metallic linings 526 within these holes (FIG. 19). These linings merge with the conductive material of islands 506 to form unitary metallic through-conductors 527 extending through the entire laminate at each island 506 so that such through conductors are placed at the locations occupied by the via holes. Thus, through conductors 527 are disposed in the same rectilinear grid of columns and rows discussed above with reference to the via holes. The columns of through conductors are spaced apart by a predetermined y-direction grid distance $D_y$, whereas the rows are disposed at an x-direction grid distance $D_x$ from one another. Likewise, the bottom base metal layer 524 extends into each riser hole to form electrically conductive hollow risers 528 (FIG. 19) extending from the bottom surface of the laminate to conductive layer 502. The through conductors 527 are integral with and electrically connected to both of the surface conductive layers 522 and 524, whereas the risers are integral with and connected to the bottom surface conductive layer 524. As best appreciated with reference to FIG. 19, each through conductor 527 extends substantially vertically. Each through conductor 527 has a space or reservoir 532 open at the bottom end of the conductor, at bottom layer 524. Each through conductor likewise has an opening 533 at its top end 534 at layer 522.

After the base material has been applied, a noble metal is selectively applied on both surfaces of the laminate. The noble metal is applied so as to cover an annular terminal region 530 surrounding the bottom end of each through conductor 527 and also to line the interior space 532 within the bottom portion of each conductor. However, the noble metal and base metal deposited in the bottom via holes do not completely fill these holes so that some portion of each space 532 is left empty and is left open to the bottom of the laminate within the terminal region 530. The noble metal is also applied to annular contact regions 538 on the top surface of the laminate adjacent the top end of each through conductor 527. Each annular contact region 538 is offset from the adjacent, associated through conductor 527 in the column or x direction discussed above. However, each annular contact region is aligned with the adjacent through conductor 527 in the row or y-direction. The center-to center distance between each such contact region and the associated, adjacent through conductor 527 is an offset distance $D_o$. The noble metal covering of each contact region 538 is in the form of an annulus defining a hole 537 at its center. The top base metal layer 522 is exposed within each such hole 537. Each annular noble-metal contact region 538 is separated from the top end 534 of the adjacent through conductor 527 by a gap 540. The base metal layer 522 on the top surface is exposed within each such gap. Likewise, there is a gap 542 (FIG. 18) between the noble metal covering of each bottom terminal region 530 and the adjacent riser, the bottom base metal layer 524 being exposed within each such gap 542.

Most preferably, the circuit panel precursors fabricated by this process are made up in two types or sets. The magnitude of the offset distance $D_o$ between the through conductors 527 and contact regions 538 is the same for both types, but the sense or sign of the offset is reversed as between the two types. This is best seen in FIGS. 20 and 21, wherein two circuit panel precursors are shown in a later stage of manufacture, after the same have been converted into circuit panels. A circuit panel precursor of the first type, and hence a circuit panel 544 of the first type (FIG. 20) made from such circuit panel has through conductors 527, and contacts 538 arranged at locations on columns 546, 548, 550 and 552 extending in the first or x direction parallel to the plane of the panel surface. Adjacent columns are separated by grid distance $D_y$. The through conductors 527, and hence the terminals 530 at the bottom ends of the through conductors are disposed in rows 554 and 546 of the rows extending in the second or y direction orthogonal to the first, x direction. Rows 554 and 556 of through conductors are spaced apart by grid distance $D_x$. That is, one through conductor 527 and hence one terminal 530 is provided at each intersection between these particular rows 554, 556 and the columns 546, 548, 550 and 552. The through conductors, and hence the terminals 530 on the bottom surface thus are disposed at all locations of a first rectilinear, regular pattern corresponding to these intersections between rows 554, 556 and the columns. The contacts 538 on the top surface are disposed in rows 558 and 560, so that one such contact is disposed at each intersection between rows 558 and 560 and columns 546, 548, 550 and 552. Accordingly, contacts 538 on the top surface are disposed at each location of a second, regular, rectilinear pattern, these locations being the intersections between the rows 558 and 560 and the aforementioned columns. The second pattern is identical to the first pattern, except that the second pattern is offset from the first pattern by the aforementioned offset distance $D_o$ in the positive x direction, i.e, in the direction to the right as seen in FIG. 18.

Thus, row 558 is offset by distance $D_o$ from row 554 in the x direction, and row 560 is likewise offset from row 556. Like the rows of through conductors, rows 558 and 560 of contacts are spaced apart by grid distance $D_x$.

The circuit panel precursors of the second set and hence the circuit panels 562 (FIG. 21) fabricated from such precursors, have their through conductors 527 and bottom-surface terminals 530 at locations of the second pattern, i.e., at intersections of rows 558 and 560 with the same columns 546, 548, 550 and 552. The contacts 538 on the top surface are disposed at the locations of the first pattern, i.e., at the intersections between rows 554 and 556 and the same columns. Thus, the circuit panel 562 formed from a precursor of the second type has contacts 538 offset from its through conductors 537 and bottom-surface terminals 530 in the minus-x or reverse direction, the offset distance being of the same magnitude $D_o$.

The multi-layer circuit manufacturing process most preferably utilizes at least one panel precursor of the first type-and at least one panel precursor of the second type. The panel precursors are converted to circuit panels by selectively treating their top and bottom surfaces, as by selectively etching the surface conductive layers 522 and 524 (FIGS. 18 and 19) of the panel precursors. The selective treatment step is conducted so as to leave portions of the base metal conductive layers as elongated surface conductors extending along the top and bottom surfaces of the panel. The elongated surface conductors 564 (FIGS. 20 and 21) on the top surfaces of each panel extend generally in the first or x direction whereas the elongated conductors 566 on the bottom surfaces of the panels (illustrated in broken lines) extend in the second or y direction orthogonal to the first direction and hence orthogonal to the top surface conductors 564. The pattern used in the selective etching procedure preferably is selected so that some or all of the top-surface conductors 564 on panel 544 are electrically connected with through conductors 527 of such panel. A top surface conductor 564 typically merges with the top end 534 of one or more through conductors 527. In like fashion, some or all of bottom- surface conductors 566 on panel 544 merge with one or more of the terminals 530 on the bottom surface of such panel and hence are electrically connected to one or more of the through conductors 527 of the panel. Some or all of the surface conductors of each panel may be connected to through conductors in similar fashion. Only a few surface conductors 564 and 566 are depicted in FIGS. 20 and 21 for clarity of illustration. However, it should be appreciated that circuit panels in accordance with preferred embodiments of the invention may include hundreds or even thousands of surface conductors and may likewise include hundreds or thousands of through conductors.

The pattern of selective surface treatment or etching is conducted so as to interconnect some, but less than all, of the through conductors 527 of each circuit panel with the associated contact 538. For example, through conductor 527a, and hence the terminal 530a at the bottom-end of such through conductor, are interconnected with the associated, adjacent contact 538a on the top surface of panel 544, whereas through conductor 527b is not interconnected with the associated contact 538b on the top surface of the panel. Likewise, through conductor 527c, and hence the terminal 530c on the bottom surface of such panel are electrically connected to contact 538c, whereas some of the other through conductors on the same panel are not connected to contacts. The selective interconnection is accomplished by selective etching of the base metal in the gaps 540 (FIGS. 18 and 19) between the top ends 534 of the through conductors and the contacts 538. Where a connection is desired, the base metal in the gap is left intact so as to form a short lead 570 (FIGS. 20 and 21) between the top end of the through conductor and the associated contact 538. Where no interconnection is desired, the base metal in the gap is removed in the etching process. For example, in a typical etching process using photoresist, where the resist is applied and selectively cured by exposure to light, the resist overlying a gap 540 would be cured and hence left in place to impede etching and thus leave a lead 570, but left uncured so that the resist is removed and the metal is etched where the connection is not desired. The areas of the top and bottom surface on each panel constituting bottom terminals 530 of the through conductors and the contacts 538 are not affected by the selective treatment or etching process. These areas preferably are covered by cured resist during the etching process. Also, the noble metal covering on each of these areas is substantially resistant to the etching process.

In the same fashion, the selective etching process applied to the bottom surfaces of the panels is controlled so as to selectively leave base metal in gaps 542 (FIGS. 18) between terminals 530 and the bottom ends of risers 528. This forms interconnections 572 (FIGS. 20 and 21) between terminals 530, and hence through conductors 527 and risers 528. Here again, where no interconnection is desired, the base metal in the gap is removed. As each such interconnection 572 connects one terminal 530 and hence one through conductor to a riser 528, and as each riser 528 is electrically connected with the continuous portions of internal conductive layer 502, each such interconnection 572 serves to connect one terminal and one through conductor to the continuous internal conductive layer. Typically, only a few of the through conductors on each panel are connected to the continuous conductive layer 502. The selective treatment process may also form connections between top surface conductors 564 and contacts 538, whether or not the particular contacts are connected to through conductors. Additionally, bottom surface conductors 566 may be connected to risers 528, whether or not the risers are connected to through conductors.

The patterns of interconnections between the through conductors and the contacts 538 on the top surfaces are dictated by circuit requirements. As further explained below, the interconnections between the through conductors and the contacts serve to establish multilayer through conductors extending through plural panels after assembly, whereas electrical connection between through conductors in different panels in the finished assembly is interrupted where the interconnections 570 between through conductors and contacts are absent. The patterns of the surface conductors 564 and 566 and their connections to the other elements discussed above are also dictated entirely by circuit requirements.

The same selective treatment or etching process used to form the elongated conductors and interconnections also forms "fiducial" or guide marks 574 and 575 on the top and bottom surfaces of each panel. These marks are formed from portions of the top metal layer which are left in place during the etching process. Because the fiducial marks are formed by the same selective treatment step as is used to form the other features, the fiducial marks are precisely located relative to the other features formed in the selective treatment process. In particular, the fiducial marks are precisely located in relation to the elongated conductors on the top and bottom surface of each panel Most preferably, where the etching process includes selective exposure to light, as in curing of a photoresist, the fiducial marks are formed by selective exposure using the same or pattern as is used to form the other features. To provide precise registration of features on the top and bottom surfaces of the panel, both the top and bottom surfaces should be exposed in a single exposure step. The fiducial marks are placed at preselected locations relative to the contacts and terminals. Thus, the fiducial marks 574 on the top surface are offset from the closest row 560 of contacts 538 in the x direction by a predetermined distance $D_f$, whereas the fiducial marks 575 on the bottom surface of each panel are offset from the closest row 556 of terminals 530 by the same distance $D_f$. Accordingly, the fiducial marks 574 on the top surface of each panel are offset from the fiducial marks 575 on the bottom surface of the same panel by an x-direction offset distance equal in magnitude and sign to the offset distance $D_o$ between the through conductors 527 and contacts 538 of the panel in question. Thus, the offset distance from fiducial marks 575 on the bottom surface of first-type panel 544 to fiducial marks 574 on the top surface of that panel is in the positive x-direction (to the right in FIG. 20). The offset distance from the bottom fiducial mark 575 of second-type panel 562 (FIG. 21) to the top fiducial mark 574 is in the negative x direction. The fiducial marks desirably are rectangular so that they have well-defined edges extending in the x and y directions. These edges can be readily detected by automated vision alignment systems.

The assembly method also utilizes interposers as discussed above in connection with the lamination technique. An interposer (FIGS. 22) has a generally planar or sheetlike body 576 of dielectric material with a top surface 577 and a bottom surface 579. Each interposer has masses 578 of flowable electrically conductive material extending through the body between surfaces 577 and 579. The masses 578 are disposed in at spaced-apart-locations in a rectilinear grid of rows and columns corresponding to the grids of rows and columns in the panels. That is, the masses 578 are disposed in columns 581, 583, 585, 587 extending in a first or x direction in the plane of the interposer body, and in rows 589, 591 extending in a second or y-direction perpendicular to the x-direction. The spacing or x-direction distance between rows 589, 591 is the same as the distance $D_x$ between rows of contacts on the panels, whereas the spacing or y-direction distance between columns 581, 583, 585, 587 is the same as the distance $D_y$ between adjacent columns of contacts on the panels.

Each interposer 580 has fiducial marks 584 exposed on its top and bottom surfaces. Most preferably, the fiducial marks are applied in the same process as is used to control positioning of the flowable conductive material. For example, where the flowable conductive material is disposed in holes extending through the interposer body, the fiducial marks may be holes extending through the body and formed in the same process as employed to form the holes for masses 578. Conversely, where the flowable conductive material is applied by silk screening or another printing process, the fiducial marks can be formed from the flowable conductive material and can be printed in the same operation as the conductive masses 578. The x-direction distance $D_f$ between fiducial marks 584 on the interposer and the closest row of masses 578 is the same as the distance $D_f$ between the top-surface fiducial marks 574 on the panels and the rows of contacts 538, and the same as the distance $D_f$ between the bottom-surface fiducial marks 575 and the rows of terminals 530 (FIGS. 20 and 21).

As discussed in greater detail above in connection with the lamination technique, each interposer most desirably includes a layer of flowable dielectric material at its top surface 577 and a similar layer of flowable dielectric material at its bottom surface 579.

In one step of the assembly method, at least one circuit panel 544 of the first type and at least one panel of the second type are stacked together with the interposers in superposed, top surface to bottom surface relation, and with circuit panels 544 of the first set and panels 562 of the second set being disposed in alternating order of the stack. A stack 569 is illustrated in FIG. 23. The circuit panels define interfaces therebetween. These interfaces are of two types: a first type of interface 571 where the top surface of a first-set circuit panel 544 faces the bottom surface 516 of a second-set panel 562, and a second type of interface 573 where the top surface of a second-type panel 562 faces the bottom surface 516 of a first-set circuit panel 544. An interposer 580 is disposed at each first-type interface so that a the interposer lies between the top surface of each first-type panel and the bottom surface of the next adjacent second-type panel. Likewise, at each second-type interface, an interposer 580 is disposed between the top of a second-set panel 562 and the bottom surface of the next superposed first-type panel 544. Thus, the interposers and panels are arranged in alternating sequence, with the interposers interleaved between the panels. The panels are aligned with one another in the directions parallel to their respective planes (the x and y directions discussed above) so that their respective first and second patterns are in registration with one another. Thus, the panels are aligned so that row 554 on each panel in the stack lies in a common plane 554'. Likewise, rows 556, 558 and 560 on each of the panels lie in common planes 556', 558' and 560' respectively. In the same way, the columns 546, 548, 550, and 552 lie in common planes, which planes are parallel to the plane of the drawing as seen in FIG. 23.

At each interface 571 of the first type the rows 581, 583 of conductive masses are aligned in planes 558' and 560'. Thus, at each interface 571 of the first type, contacts 538 on the top surface of a first-set circuit panel 544 are aligned with terminals 534 on the bottom surface of a second-set panel 562, and masses of flowable conductive material 578 of an interposer 580 at such interface is aligned with these elements. These aligned elements are disposed at all locations of the in-registration first patterns. For example, contact 538d on the top surface of the lowermost first-set circuit panel 544, terminal 530d on the bottom surface of another, second-type circuit panel 564 and conductive mass 578d are all aligned with one another at one such first-pattern location of the intersection of rows 558 (plane 558') and one of the columns.

At each interface of the second type, the interposer is positioned so that rows 581 and 583 of conductive masses are aligned in planes 554' and 556'. Thus, contacts 538 on the top surface of a second-set circuit panel 562 are aligned with terminals 530 on the bottom surface of a first-set circuit panel 544, and with a flowable conductive masses of the interposer 580. For example, contact 538e, flowable mass 578e and terminal 530e are all aligned with one another. Such alignment at the second-type interfaces occurs at all locations of the second pattern, i.e., at all locations corresponding to intersections between planes 554' and 556' (rows 554 and 556 of each stacked element) and the aforementioned columns.

The circuit panels and interposers are aligned with one another using the fiducial marks and using an automatic vision system to shift the circuit elements as desired in the x and y directions, parallel to the planes of these elements to achieve precise alignment. In this alignment process, the automatic vision system preferably looks at the top surface of the highest element already in the stack and at the bottom surface of the next element to be added to the stack. In each case, the proper alignment is achieved by placing the fiducial marks on these surfaces atop one another. Thus, the offsets between desired locations for the conductive masses of the interposers between first-type interfaces 571 and second-type interfaces 573 are produced automatically, as a result of the offsets between top and bottom fiducial marks 574 and 575 on the panels.

The circuit panels and interposers are then fused into a unitary assembly by momentarily bringing the flowable dielectric and conductive materials of the interposers to a fluid condition, as by applying heat while holding the stacked elements under pressure. In the same way as discussed above with reference to the lamination technique, the flowable conductive material of the interposers unites an electrically interconnects each aligned contact and terminal. This interconnection is non-selective. That is, wherever a contact 538 on the top surface of a panel is aligned with a terminal 534 on the bottom surface of the next immediately superposed panel, such contact and terminal are joined with one another. The spaces 532 open at the bottom of each through conductor 527 (FIG. 19) serve as reservoirs for the flowable conductive material in the same way as discussed above with regard to the lamination technique. Also, the flowable conductive material on the interposers bonds the circuit panels together and fills irregularities on the top and bottom surfaces of the panels, such as irregularities between the surface conductors 564 and 566 on the top and bottom surfaces of the various panels.

The conjoined through conductors and contacts form composite vertical conductors extending through plural panels. A typical set of composite vertical conductors is illustrated in FIG. 24. These composite conductors are formed from the through conductors, terminals and contacts disposed at two pattern locations, that is, location 588 of the first pattern and location 590 of the second pattern. In FIG. 24, the dielectric portions of the circuit panels and interposers are omitted for clarity of illustration, and the internal conductive layer 502 within the center of each panel is also partially largely omitted for clarity of illustration. As shown, the lowermost circuit panel has a contact connector 570*f* extending between the top end of through conductor 527*f* and the associated contact 538*f*. Contact 538*f* is connected to the superposed terminal 530*g* by a conductive mass 578, so that through conductors 527*f* and 527*g* are electrically connected to one another to form one composite vertical conductor 589 extending through the two lowermost panels in the assembly. This composite conductor extends from the terminal 530*f* at the bottom of through conductor 527*f* to the top of through conductor 527*g*, and serves to interconnect surface conductor 564*g* on the top of the second lowest panel in the stack with surface conductor 566*f* on the bottom of the lowermost panel. Because there is a riser connector 572*f* extending between terminal 530*f* and the riser 528*f* of the lowermost panel, this composite vertical conductor and hence surface conductors 564*g* and 566*f* are electrically connected to the internal conductive layer 502*f* of the lowermost panel which serves as a power or ground plane.

There is no contact connector interconnecting the top end of through conductor 527*g* with the associated contact 538*g*. Thus, although contact 538*g* is connected to the terminal 530*h* on the next superposed panel, this connection does not serve to electrically connect through conductor 527*g* with through conductor 527*h*. A conductor 564*gg* on the top surface of the second panel is electrically connected to contact 538*g* and hence will be electrically connected to through conductor 527*h* of the third panel, but these elements are isolated from through conductor 527*g* and from the remainder of the composite vertical conductor in the two lowermost panels. The three uppermost panels all have contact connectors 570*h*, 570*i* and 570*j* on their respective top surfaces. Accordingly, through conductors 527*h*, 527*i* and 527*j* of these panels are joined into a unitary, composite vertical conductor 595 extending upwardly from terminal 530*h* and contact 538*g* and ending at the top surface of the topmost panel, where it is connected to conductor 564*j*. Although some of the panels penetrated by this composite vertical conductor have risers 528*h* and 528*j* at adjacent riser locations, these risers are disconnected from the associated terminals and through conductors. That is, no riser conductors are provided on the bottom surfaces of these particular panels. Accordingly, the composite vertical conductor is electrically isolated from the central conductive layers 502*h* and 502*j* of the panels having such risers. Various ones of the surface conductors 564 and 566 on the different panels are connected to this composite vertical conductor, as where these elongated conductors are so formed as to intersect the contacts 538, the terminals 530 or the top-ends 534 of the through conductors on the various panels.

The composite vertical conductors 593 and 595 each extend in a zigzag fashion, passing from a location 588 of the first pattern to a location 590 of the second pattern. The disposition of risers 528 in x-direction alignment with through conductors 527, interspersed between the through conductors of a particular row, avoids interference between the bottom surface conductors 566 and the risers and riser connectors. Thus, because the bottom-surface conductors 566 extend in the y direction, they run alongside of the rows, displaced from the through conductors in the x-direction. Likewise, disposition of the contacts 538 in y-direction alignment with the through conductors avoids interference with the top-surface conductors 564. The top surface conductors extending in the x-direction are necessarily displaced from the through conductors in the y-direction, and hence are clear of contacts 538.

FIG. 25 illustrates one way in which the contact terminals and conductive material masses can be used to provided a "jog" or offset. One panel includes a pair of top-surface conductor portions 564*k*, 564*l* which extend in the first or x-direction but which are offset from one another in the second or y-direction. One of these conductors is joined to a first contact 538*k* whereas the other conductor 564*l* is joined to another contact 538*l* on the same panel and in the same row. Contact 538*k* is joined by one of the flowable conductive material masses 578*k* to a terminal 530*k* on the bottom surface of the next higher panel. That terminal in turn is connected via a bottom-surface conductor 566*k* of such next higher panel to another terminal 530*l*, which in turn is connected by a flowable conductive material mass 578*l* to contact 538*l*. This joins the two conductor portions 564*k* and 564*l* on the top-surface of the first mentioned panel into a composite, jogged conductor extending in the x-direction but having a jog or offset in the y-direction. As will be appreciated, this type of connection can be made in combination with other types of connections. For example, terminal 530*k* or 530*l* can be connected to additional panels, or to the top surface of the higher panel via the through conductors 527*k* or 527*l*.

The inverse type of connection, to form a jog in a y-direction conductor is illustrated in FIG. 26. That composite jogged y-direction conductor includes a pair of bottom-surface conductor portions 566*m* and 566*n* on the bottom-surface of one panel. Conductor portion 566*m* is connected via a terminal 530*m* and flowable conductive mass 578m to a contact 538m on the top surface of the next lower panel. Contact 538m in turn is connected via an x-direction or top-surface conductor 564m on such next lower panel to a further contact 538n on the same panel surface. That contact in turn is connected via a flowable conductive material mass 578n to another terminal 530n on the bottom surface of the first mentioned panel. Terminal 530n in turn is connected to the other conductive portion 566n. Thus, the contacts, terminals and flowable masses, together with conductor 564m on one panel are used to join two conductor portions 566m and 566n on another panel into a composite, electrically continuous y-direction connector having a jog or offset in the x-direction.

In generally similar fashion, jogged conductors can be made in a single panel. For example, a jogged x-direction conductor can be made by connecting a top-surface or x-direction conductor portion on one panel to the top end of a through conductor in that panel, connecting the bottom end of such through conductor to a y-direction conductor on the bottom surface of the panel and connecting that bottom surface conductor to yet another through conductor which in turn is connected at its top end to a further x-direction or top surface conductor portion. The reverse arrangement can be used to provide a jogged y-direction conductor. As will be appreciated, the ability to provide such jogged conductors either within a single panel or using conductor portions on multiple panels provides greatly enhanced design versatility. Where a conductor must be interrupted on one panel by some other feature or component, the conductor can be rerouted or jogged around the obstruction with ease. The interconnections between x-direction and y-direction surface conductors discussed above in the context of "jogged" conductors can also be used for other purposes. Thus, x-direction and y-direction conductors on the same panel or on different panels can be interconnected freely with one another as required by the circuit design.

As will be readily appreciated, the number of panels in a stack according to this aspect of the present invention can be varied widely from two panels to as many panels as desired. Essentially any layout of the composite vertical or Z-direction conductors and X-direction and Y-direction surface conductors can be provided. The circuit panel precursors and interposers can be fabricated as stock items in large quantity. There is no need to vary the design of the circuit panel precursors or the design of the interposer to accommodate differing circuit requirements. All that is required to customize the assembly, including the locations and number of composite vertical conductors, is selective treatment of the panel surfaces. There is no need for any special drilling or other through conductor fabrication technology in the assembly plant. Rather, the customization steps involve only standard surface treatment technology such as etching which is widely known and widely utilized in the circuit panel industry as, for example, in manufacture of conventional circuit boards. Moreover, the assembly can be quite compact. Thus, the lengths of contact connectors 570 and riser connectors 572 relative to the other components are greatly exaggerated in the drawings. In practice, these connectors may be typically as short as about 0.25 mm.

Figure 27:
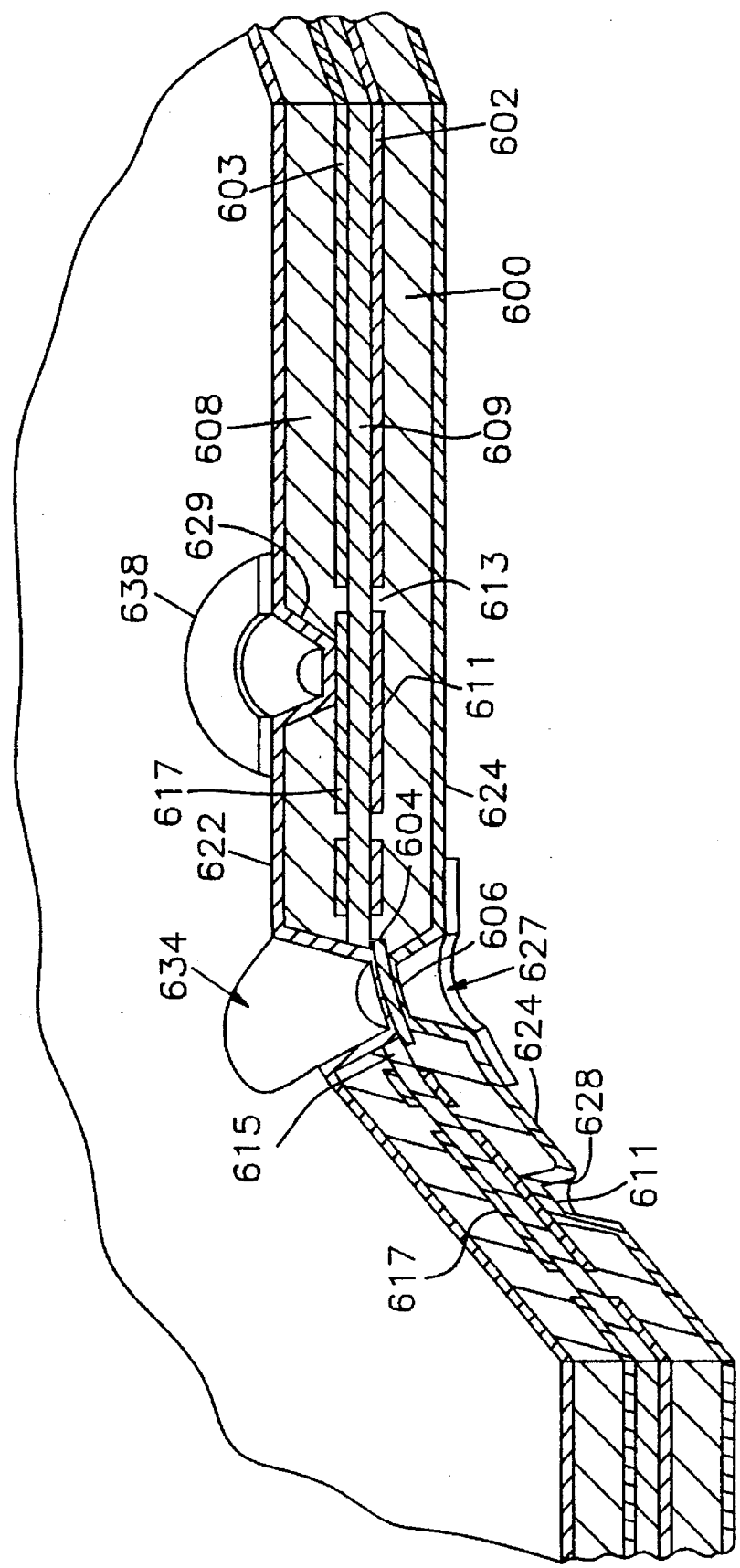

The methods, panel precursors and assemblies discussed above can be varied in numerous ways. A panel precursor in accordance with one such variant is illustrated in FIG. 27. This panel precursor includes a first or lower dielectric sheet 600 and a second or upper dielectric sheet 608 as discussed above. However, two internal conductive layers 602 and 603 are provided rather than the single internal conductive layer of the interposers discussed above. An additional dielectric layer 609 is disposed between conductive layer 602 and 603 so that these layers extend generally parallel to one another. Layer 602 is selectively treated in substantially the same way as the internal conductive layer discussed above. That is, layer 602 has islands 606 disposed within apertures 604. Layer 602 additionally has a region 611 isolated from the continuous portion of the layer, this region being surrounded by a channel 613 in the layer. The second conductive layer 603 has apertures 615 aligned with the islands 606 of layer 602. The through conductor structure 627 includes portions of the top base metal layer 622 and bottom base metal layer 624 forming tubular linings in via holes in the dielectric layers and extending to each island 606. The through conductor structure extends through the aperture 615 in layer 603. Second conductive layerr 603 further includes a region 617 isolated from the remainder of layer 603 and aligned with the isolated region 611 of layer 602. A riser 628 lined with conductive base metal aextends from bottom base metal layer 624 to the isolated region 611 of layer 602. A further riser structure 629 is provided within a contact 638. This riser structure extends from the top base metal layer 622 to panel 617. Several sets of regions 611 and 617 are provided at locations spaced apart from one another in the x and y or -inplane directions, each such set having an associated pair of risers 628 and 629. The regions 611 and 617 of each such set are aligned with one another in the x and y directions.

Circuit panels and circuit panel precursors in accordance with this embodiment of the invention are made in a process much like that discussed above. The circuit panel precursor shown in FIG. 24 is converted to a circuit panel by selectively etching the top and bottom base metal layers, so as to selectively connect through conductors to contacts and also form elongated surface conductors extending along the top and bottom surfaces of the panel as discussed above. Some of these surface conductors and through conductors may be selectively connected to the risers 628 and 629. Each pair of panels 611 and 617 form the opposite plates of a capacitor. The selective connection of risers 628 and 629 to the surface conductors and/or through conductors serve to connect these capacitor plates to the other electrical components in the system. Of course, the plates are present in the circuit panel precursors and hence need not be purchased or handled separately by the manufacturer. In a variant of this approach, individual, isolated plates may be provided in only one of the internal conductive layers 602 and 603, whereas the other one of these layers may be left as a substantially continuous conductive layer apart from the apertures associated with the through conductors. In such an arrangement, all of the capacitors would have one side connected in parallel. For example, where the continuous portion of such a conductive layer is connected to ground, the internal capacitors would provide capacitance to ground. In a further variant, some of the through conductors can be fabricated with connections either to an isolated region of a conductive interior element or to a continuous interior layer. Thus, if a particular island is left connected to layer 602 during the layer-forming process, the through-conductor formed at that island will have an internal connection to the layer.

Figure 28:
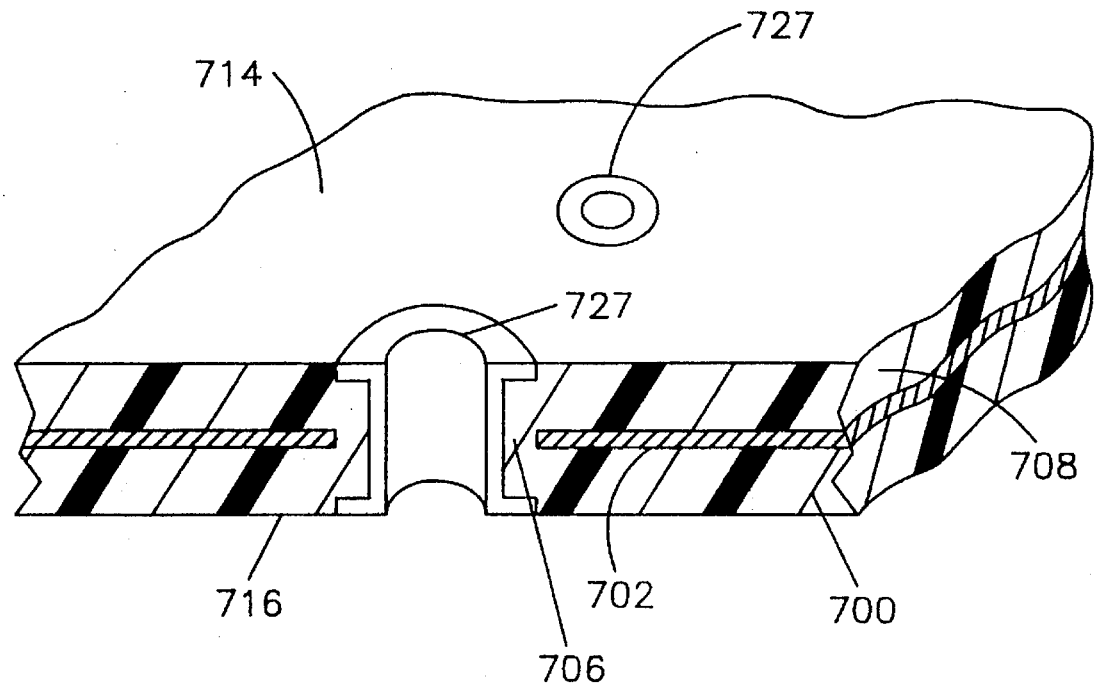
Figure 29:
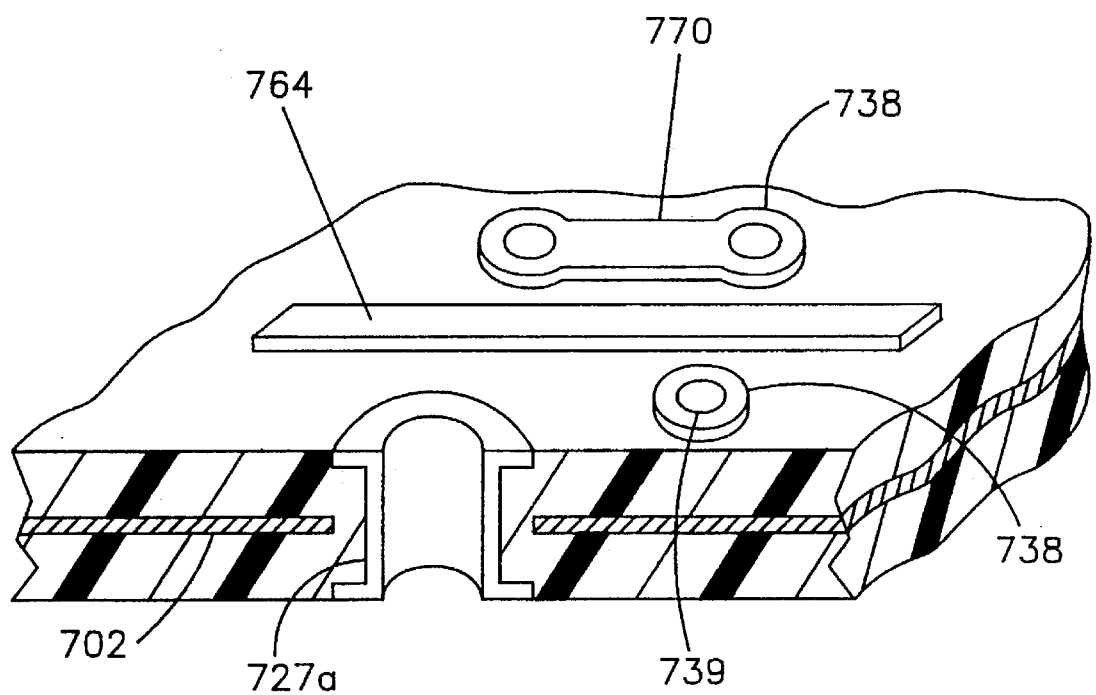

In the embodiments discussed above, the circuit panel precursor is provided with a substantially continuous metal layer and that metal layer is selectively treated by subtractive etching to remove unwanted portions and thereby form the desired patterns of surface conductors and interconnections between through conductors and top-surface contacts. The reverse arrangement is illustrated in FIG. 28 and 29. The precursor of FIG. 28 has a body including dielectric layers 700 and 708 and an internal conductive layer 702, and through conductors 727 extending between the top surface 714 and bottom surface 716. The precursor does not have substantial conductive layers on its top and bottom surfaces. Although a thin layer metallic material may be provided as a base for future plating, such thin layer does not have sufficient thickness to form the required conductive elements. The selective treatment of the top and bottom surfaces involves selective deposition of conductive material to form contacts 738 (FIG. 29) and contact connectors 770 connecting these contacts to the through conductors 727. Following such selective deposition, the thin layer is removed by a brief etching process. Contacts 738 are formed at locations of a regular, rectilinear pattern such as the rows and columns discussed above in connection with the other embodiments. Most preferably, contacts are provided at each such location. For example, location 739 is a location of the regular contact pattern. A top surface contact 738a is formed at location 739, even though the associated contact connector is entirely omitted. Thus, the contact is formed even where it is not connected to any other conductive element of the panel, and even where the contact will serve no electrical function. It is highly desirable, although not absolutely essential, to provide contacts at every location of the regular patterns so that every flowable mass in each interposer confronts a contact and a terminal, rather than a bare spot on the panel body. The same selective deposition process used to form the contacts and contacts connectors is also used to form the surface conductors 764 on the top surface and the corresponding elongated conductors on the bottom surface. Panels formed in this manner can be used in exactly the same way as panels formed by selective etching as discussed above. Essentially any selective deposition process suitable for depositing conductive materials can be used to fabricate circuit panels in this manner. The panel precursor and panel of FIGS. 28 and 29 further differ from the panels and precursors discussed above in that the through conductors 727 of the panels in FIGS. 28 and 29 are simple, continuous "barrel" vias extending entirely through both dielectric layers through apertures 706 in the internal conductive layer 702. These vias are formed by conventional hole-forming and plating processes.

As illustrated in FIG. 30, the fiducial marks used to align the interposers and panels may vary from those discussed above. The interposer of FIG. 26 has an array 801 of fiducial marks at each corner, only one such array being visible in FIG. 26. Each such array includes a plurality of holes 803 arranged in a rectilinear grid having a first regular spacing distance 805 in the x direction and a second regular spacing distance 807 in the y direction. These distances may be different or, preferably, the same. Holes 803 extend entirely through the body of the interposer. The circuit panel has arrays 811 of reflective spots 813. The spots 813 of each such array are likewise arranged in rectilinear, regular patterns so that the spots in each such array have a fixed center-to-center distance 815 in the x direction and a center-to-center distance 817 in the y direction. Distance 817 may be different from, or preferably, the same as distance 815. The distances between spots 813 are different from the corresponding distances between holes 803. That is, the x direction center-to-center distance 815 between spots 813 is different from the x direction center-to-center distance 805 between holes 803, and y direction distance 817 differs from y direction distance 807 of the holes. Only one hole 803 can be fully aligned with a spot 813 in any relative position of the interposer and panel. Alignment of holes and spots can be detected by sighting downwardly through the holes towards the spots. Arrays 801 and 811 may be arranged so that the panel and interposer are in the desired relative position when the central hole 803a is in alignment with the central spot 813a of the panel. In effect, the array serves as a two-dimension vernier scale. Provided that the arrays are aligned with one another in the desired relative positions to within an error less than any of distances 805, 807, 815 and 817, then one hole 803 and one spot 813 will be aligned with one another. The identity of the aligned hole and spot will indicate the amount and direction of the residual misalignment. For example, if hole 803b is aligned with a spot, the interposer should be shifted in one direction relative to the panel to bring holes 803a and 813a into alignment, whereas if hole 803c is aligned with a spot, the interposer should be shifted in the opposite direction to reach the desired alignment.

As will be appreciated, numerous further variations and combinations of the features described above can be utilized without departing from the present invention as defined by the claims. For example, although the use of an interposer with flowable conductive material and flowable dielectric materials as discussed above, is most definitely preferred inasmuch as it forms reliable interconnections and bonds the circuit panel together, other nonselective connection methods can be used for connecting terminals and contacts. For example, the interposer may be omitted and the terminals and contacts may be fused directly with one another, as by flowable electrically conductive materials carried on each terminal and/or each contact. Such an arrangement desirably would utilize a dielectric insulating sheet at each interface, each such sheet corresponding to the regular pattern of terminals and contacts at the interface. For example, where terminals of a first regular pattern are to be connected with the contacts in the same first regular pattern, the dielectric sheet would have holes in the same first regular pattern. At the next adjacent interface, where the terminals and contacts are disclosed in the second pattern, the dielectric sheet would have holes in that second regular pattern. If the surface conductors on the surfaces of the panels are covered by dielectric material carried on the panel themselves, the dielectric sheets may be omitted. In a further variant, the terminals and contacts can be connected by a layer of so-called z-conducting adhesive, i.e., an adhesive having anisotropic electrical conductivity. In this arrangement as well, a dielectric with holes may be provided at each interface of the panels themselves may be provided with dielectric coverings extending over the surface conductors but not extending onto the terminals or contacts. Also, terms such as "top", "bottom", "vertical" and the like as used in this disclosure should be understood as referring to an arbitrary frame of reference, rather than to the ordinary gravitational frame of reference. Thus, the upward vertical direction of a component or assembly may extend upwardly, downwardly or horizontally in the normal gravitational frame of reference. The tubular or barrel vias discussed with reference to FIGS. 28 and 29 may be used with the preplated surface conductive layers and subtractive etching customization process as discussed with reference to FIGS. 18 through 21.

As these and other variations and combinations of the features discussed above may be utilized without departing from the invention, the foregoing description of the preferred embodiments should be taken by way of illustration rather than by way of limitation of the features described above

What is claimed is:

1. A method of making a circuit panel precursor comprising the steps of:

(a) applying a first electrically conductive material on a first surface of a first dielectric sheet so that said conductive material forms islands spaced apart from one another;

(b) applying an additional dielectric material over said first conductive material so as to provide a second dielectric sheet and thereby form a laminate with said first conductive material disposed between said dielectric sheets and with dielectric material surrounding each said island; and (c) forming holes in each said dielectric sheet in alignment with said islands so that each said island is exposed through said holes to top and bottom surfaces of the laminate.

2. A method as claimed in claim 1 wherein said step of applying a first conductive material is performed so that said first conductive material forms a continuous layer with apertures, each said island being disposed within one such aperture.

3. A method as claimed in claim 2 wherein said step of applying said first electrically conductive material includes the step of applying the electrically conductive material to form said continuous layer and then selectively removing annular portions of said layer to thereby form said apertures and islands.

4. A method as claimed in claim 3 wherein said step of applying said conductive material is performed by laminating a sheet of said first electrically conductive material to said first dielectric sheet.

5. A method as claimed in claim 1 wherein said step of applying said second dielectric material includes the step of laminating a coherent sheet of said second dielectric material over first conductive material.

6. A method as claimed in claim 1 wherein said step of forming holes in each said dielectric sheet includes the step of applying radiant energy to said dielectric layers from opposite sides of said laminate in registration with said islands.

7. A method as claimed in claim 1 wherein said step of forming said holes in said first dielectric layer includes the step of providing said holes before said step of applying said first electrically conductive material.

8. A method as claimed in claim 1 further comprising the step of depositing an electrically conductive via material in said holes to form through conductors extending to the top and bottom surfaces of the laminate and incorporating said islands.

9. A method as claimed in claim 8 further comprising the step of applying an electrically conductive surface material to the top and bottom surfaces of said laminate so that said surface material is electrically connected to said through conductors.

10. A method as claimed in claim 9 wherein said steps of applying said via material and said surface material are performed simultaneously by immersing the laminate in a plating solution.

11. A method as claimed in claim 1 wherein each of said dielectric layers is less than about 150 micrometers thick and each of said holes has a minimum diameter less than about 250 micrometers.

12. A method of making a multilayer circuit assembly comprising the steps of:

(a) providing a first circuit panel having a dielectric body with oppositely directed top and bottom surfaces, contacts on its top surface at locations of a first regular grid pattern terminals on its bottom surface, and through-conductors electrically connected to said terminals and extending to the top surface of the panel, and a second circuit panel having a dielectric body with a bottom surface and terminals at locations of said first regular grid pattern on the bottom surface of such panel, said providing step including the step of customizing said first circuit panel by selectively treating the top surface of such panel so that less than all of the through conductors of such panel are connected to contacts of such panel;

(b) stacking said circuit panels in superposed, top-surface to bottom surface relation so that the top surface of said first circuit panel faces the bottom surface of said second circuit panel at a first interface and said first regular grid patterns on said facing surfaces are in registration with one another, with said contacts of said first panel being aligned with said terminals of said second panel at least some locations of said in-registration patterns; and (c) nonselectively connecting all of said aligned contacts and terminals at said interface, whereby less than all of said through conductors of said customized panel are connected to terminals of said adjacent panel.

13. A method of making a multilayer circuit assembly comprising the steps of:

(a) providing a first circuit panel having a dielectric body with oppositely directed top and bottom surfaces, contacts on its top surface at all locations of a first regular grid pattern, terminals on its bottom surface, and through-conductors electrically connected to said terminals and extending to the top surface of the panel, and a second circuit panel having a dielectric body with a bottom surface and terminals at all locations of said first regular grid pattern on the bottom surface of such panel, said providing step including the step of customizing said first circuit panel by selectively treating the top surface of such panel so that less than all of the through conductors of such panel are connected to contacts of such panel;

(b) stacking said circuit panels in superposed, top-surface to bottom surface relation so that the top surface of said first circuit panel faces the bottom surface of said second circuit panel at a first interface and said first patterns on said facing surfaces are in registration with one another, with said contacts of said first panel being aligned with said terminals of said second panel at all locations of said in-registration patterns; and (c) nonselectively connecting all of said aligned contacts and terminals at said interface, whereby less than all of said through conductors of said customized panel are connected to terminals of said adjacent panel.

14. A method as claimed in claim 13 wherein said first circuit panel has one said through conductor disposed adjacent to each said location of said first regular grid pattern, said step of customizing the top surface of said first panel being performed so that each said through conductor which is connected to one said contact is connected to a contact at the location of said first regular pattern adjacent to that through conductor.

15. A method as claimed in claim 14 wherein said through conductors are disposed in a regular grid pattern corresponding to said first regular grid pattern but offset therefrom in a horizontal direction.

16. A method as claimed in claim 13 wherein said step of nonselectively connecting includes the steps of placing an interposer bearing discrete masses of flowable conductive material at said interface so that said masses are disposed at all locations of said first regular grid pattern at said first interface and bringing all of the flowable conductive material of said interposer to a fluid condition.

17. A method as claimed in claim 13 wherein said dielectric body of said second circuit panel has a top surface directed oppositely from its bottom surface, and through conductors electrically connected to at least some of the terminals on the bottom surface of such panel extending to the top surface of the panel, whereby less than all of the through conductors of said first panel will be connected to through conductors of said second panel to form composite vertical conductors extending through both said first and second panels.

18. A method as claimed in claim 17 wherein said second panel has terminals at all locations of said first pattern and through conductors connected to all of said terminals, whereby all of those through conductors of said first panel which are connected to contacts of such panel will be connected with through conductors of the second panel to form composite vertical conductors.

19. A method as claimed in claim 18 wherein said providing step further includes the step of selectively treating the top surface of said second panel so as to connect less than all of said through conductors of said second circuit panel to contacts disposed on the top surface of said second circuit panel at locations of a second regular grid pattern corresponding to said first regular grid pattern but offset therefrom in a horizontal direction, the method further including the steps of providing a third circuit panel having a dielectric body defining top and bottom surfaces, said third panel having terminals on its bottom surface at locations of said second regular grid pattern, superposing said third panel on said second panel so that the bottom surface of said third panel faces the top surface of said second panel at a second interface, and so that said second patterns are in registration with one another, whereby contacts of said second panel and terminals of said third panel are aligned with one another at said second interface, and nonselectively connecting all of said aligned terminals and contacts at said second interface.

20. A method as claimed in claim 19 wherein said third panel has a top surface and through conductors extending from the terminals of such panel to the top surface thereof, the through conductors of each of said first, second and third panels extending substantially vertically between the top and bottom surfaces of such panel, the stacking and superposing steps being performed so that the through conductors of the first and third panels are aligned with one another.

21. A method as claimed in claim 20 wherein said through conductors of said second circuit panel are disposed at locations of said first regular grid pattern and said through conductors of said first and third circuit panel are disposed at locations of said second regular grid pattern.

22. A method as claimed in claim 21 wherein said first and second regular grid patterns are rectilinear grid patterns including columns of locations extending in a first horizontal direction and rows of locations extending in a second horizontal direction orthogonal to said first horizontal direction, said first and second grid patterns being offset from one another in said first horizontal direction.

23. A method as claimed in claim 22 wherein said steps of selectively treating said top surfaces of said first and second panels includes the step of forming conductors extending in one of said first and second directions on said top surfaces of said first and second panels, the method further comprising the step of selectively treating said bottom surfaces of said first and second panels so as to form conductors extending in the other one of said first and second directions on the bottom surfaces of said first and second panels.

24. A method as claimed in claim 23 wherein said steps of forming conductors are performed so that the conductors on the top surfaces of said first and second panels extend in said first horizontal direction and the conductors on said bottom surfaces of said first and second panels extend in said second horizontal direction.

\* \* \* \* \*

UNITED STATES PATENT AND TRADEMARK OFFICE
CERTIFICATE OF CORRECTION

PATENT NO. : 5,570,504

DATED : Nov. 5, 1996

INVENTOR(S) : DiStefano et al

Page 1 of 3

It is certified that error appears in the above-identified patent and that said Letters Patent is hereby corrected as shown below:

Item [57] in the Abstract, line 4, change "bottomend" to read -- bottom end --.

Item [57] in the Abstract, line 17, change "there" to read -- they --.

Column 1, line 66, after the word "prepregs" insert a comma.

Column 2, line 31, change "ground" to read -- around --.

Column 2, line 56, change "is" to read -- are --.

Column 4, line 22, change "have" to read -- having --.

Column 7, line 48, change "ad" to read -- and --.

Column 9, line 15, change "a" to read -- an --.

Column 10, line 65, after the word "contacts at" insert the word -- at --.

Column 13, line 30, change "views" to read -- view --.

Column 14, line 28, change "he" to read -- the --.

Column 19, line 18, after the words "may be" delete "a".

Column 20, line 10, before the word "electrically" change "the" to read -- then --.

UNITED STATES PATENT AND TRADEMARK OFFICE
CERTIFICATE OF CORRECTION

PATENT NO. : 5,570,504

DATED : Nov. 5, 1996

INVENTOR(S) : DiStefano et al

It is certified that error appears in the above-identified patent and that said Letters Patent is hereby corrected as shown below:

Column 22, line 42, change "38'" to read -- 38" --.

Column 23, line 14, after the word "Thus," insert the word -- the --.

Column 24, line 14, change "a" to read -- an --.

Column 24, line 55, after "410" insert the word -- are --.

Column 27, line 1, before "512" delete "hole".

Column 27, line 27, change "such" to read -- with --.

Column 28, line 41, change "has" to read -- as --.

Column 30, line 64, after the word "panel" insert a period.
Column 30, line 67, after the word "same" delete the word "or".

Column 32, line 15, before the words "the interposer" delete "a".

Column 33, line 15, change "an" to read -- and --.

Column 36, line 15, change "layerr" to read -- layer --.
Column 36, line 18, change "aextends" to read -- extends --.

UNITED STATES PATENT AND TRADEMARK OFFICE
CERTIFICATE OF CORRECTION

PATENT NO. : 5,570,504

DATED : November 5, 1996

INVENTOR(S) : DiStefano et al

It is certified that error appears in the above-identified patent and that said Letters Patent is hereby corrected as shown below:

Column 38, line 45, after the word "themselves" insert the word -- and --.

Column 38, line 64, after the "above" insert a period.

Signed and Sealed this

Twenty-fifth Day of March, 1997

Attest:

BRUCE LEHMAN

*Attesting Officer*   *Commissioner of Patents and Trademarks*